US009559206B2

(12) United States Patent
Fan et al.

(10) Patent No.: US 9,559,206 B2
(45) Date of Patent: Jan. 31, 2017

(54) FINFETS WITH NECKING IN THE FINS

(71) Applicant: Taiwan Semiconductor Manufacturing Company, Ltd., Hsin-Chu (TW)

(72) Inventors: Chun-Hsiang Fan, Hsin-Chu (TW); Kun-Yen Lu, Longtan Township (TW); Yu-Lien Huang, Jhubei (TW); Ming-Huan Tsai, Zhubei (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 0 days.

(21) Appl. No.: 14/845,983

(22) Filed: Sep. 4, 2015

(65) Prior Publication Data
US 2015/0380559 A1 Dec. 31, 2015

Related U.S. Application Data

(62) Division of application No. 14/142,435, filed on Dec. 27, 2013, now Pat. No. 9,159,552.

(51) Int. Cl.
*H01L 29/76* (2006.01)
*H01L 29/78* (2006.01)
(Continued)

(52) U.S. Cl.
CPC ..... *H01L 29/7851* (2013.01); *H01L 21/76224* (2013.01); *H01L 29/0653* (2013.01);
(Continued)

(58) Field of Classification Search
CPC ........ H01L 29/76; H01L 29/94; H01L 31/062; H01L 31/113; H01L 31/119; H01L 29/66553; H01L 29/66545; H01L 29/66795; H01L 29/78645
See application file for complete search history.

(56) References Cited

U.S. PATENT DOCUMENTS 6,207,532 B1   3/2001   Lin et al.
7,297,600 B2 * 11/2007   Oh ................... H01L 29/66553
                                                     257/E21.442
(Continued)

OTHER PUBLICATIONS

Kringhøj, P., et al., "Diffusion of ion implanted Sn in Si, Si1-xGex, and Ge," Appl. Phys. Lett. 65, 324 (1994), 4 pages.
(Continued)

*Primary Examiner* — Phuc Dang
(74) *Attorney, Agent, or Firm* — Slater Matsil, LLP

(57) ABSTRACT

A method includes forming isolation regions in a semiconductor substrate, forming a first semiconductor strip between opposite portions of isolation regions, forming a second semiconductor strip overlying and contacting the first semiconductor strip, and performing a first recessing to recess the isolation regions. A portion of the second semiconductor strip over top surfaces of remaining portions of the isolation regions forms a semiconductor fin. A second recessing is performed to recess the isolation regions to extend the semiconductor fin downwardly, with an inter-diffusion region of the first semiconductor strip and the second semiconductor strip being exposed after the second recessing. The inter-diffusion region is then etched.

20 Claims, 25 Drawing Sheets

(51) Int. Cl.
   *H01L 21/762* (2006.01)
   *H01L 29/06* (2006.01)
   *H01L 29/10* (2006.01)
   *H01L 29/165* (2006.01)
   *H01L 29/66* (2006.01)

(52) U.S. Cl.
   CPC ........ *H01L 29/1054* (2013.01); *H01L 29/165* (2013.01); *H01L 29/66795* (2013.01); *H01L 29/785* (2013.01); *H01L 29/66545* (2013.01)

(56) References Cited

U.S. PATENT DOCUMENTS

| | | | |
|---|---|---|---|
| 8,053,299 | B2 | 11/2011 | Xu |
| 8,450,813 | B2 * | 5/2013 | Luo .................. H01L 29/66795 257/401 |
| 8,470,714 | B1 | 6/2013 | Tsai et al. |
| 8,829,606 | B1 | 9/2014 | van Dal |
| 2005/0090096 | A1 | 4/2005 | Hou et al. |
| 2007/0235763 | A1* | 10/2007 | Doyle .................. H01L 29/785 257/202 |
| 2012/0138886 | A1 | 6/2012 | Kuhn et al. |
| 2012/0319211 | A1 | 12/2012 | van Dal et al. |
| 2013/0200482 | A1 | 8/2013 | Fang et al. |
| 2013/0256799 | A1 | 10/2013 | Wu et al. |
| 2014/0197458 | A1 | 7/2014 | Ching et al. |

OTHER PUBLICATIONS

Kobe, R., et al., "Composition dependence of Si and Ge diffusion in relaxed Si1-xGex alloys," J. Appl. Phys. 107, 073520 (2010); 7 pages.

Pillarisetty, R., et al., "High Mobility Strained Germanium Quantum Well Field Effect Transistor as the P-Channel Device Option for Low Power (Vcc=0.5V) III-V CMOS Architecture," 2010 IEEE International Electron Devices Meeting (IEDM), San Francisco, CA, Dec. 6-8, 2010, pp. 6.7.1-6.7.4.

Silvestri, H.H., et al., "Diffusion of silicon in crystalline germanium," Semicond. Sci. Technol. 21 (2006), pp. 758-762.

* cited by examiner

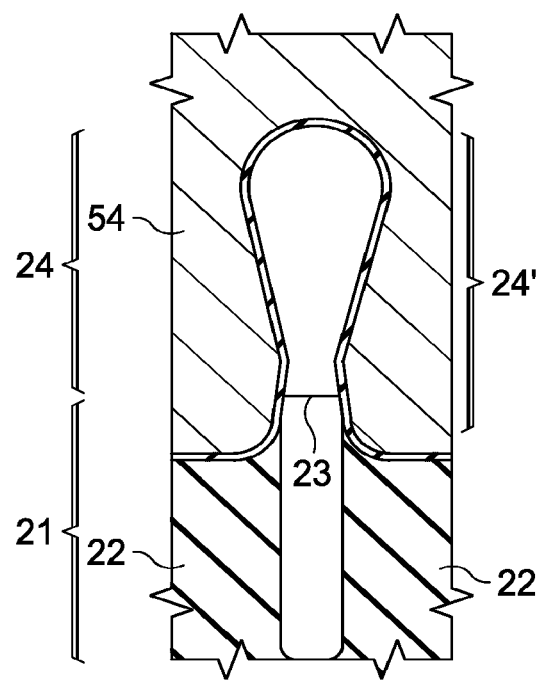
FIG. 22
FIG. 23
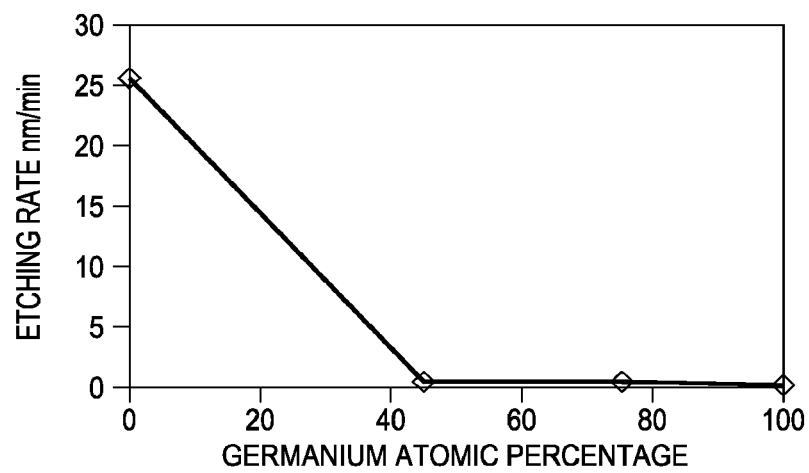

US 9,559,206 B2

FINFETS WITH NECKING IN THE FINS

PRIORITY CLAIM AND CROSS-REFERENCE

This application is a divisional of U.S. patent application Ser. No. 14/142,435, entitled "Method of Forming a Germanium-Containing FinFET," filed on Dec. 27, 2013, now U.S. Pat. 9,159,552, which application is incorporated herein by reference.

BACKGROUND

Low-power and high-speed circuit are desired in currently electronic applications such as smart phone, PADs, notebooks, and so on. Compared to Silicon, Germanium has higher mobility and lower effective mass, which benefits the drive current of Field-Effect-Transistors (FETs). Therefore, germanium is a promising material for the next-generation FETs.

BRIEF DESCRIPTION OF THE DRAWINGS

For a more complete understanding of the embodiments, and the advantages thereof, reference is now made to the following descriptions taken in conjunction with the accompanying drawings, in which:

FIG. 22 is a cross-sectional view of a semiconductor fin, a gate dielectric, and a gate electrode in accordance with some embodiments;

FIGS. 23 and 24 are etching rate profiles in the etching of inter-diffused regions in accordance with some exemplary embodiments;

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

A Fin Field-Effect Transistor (FinFET) and the method of forming the same are provided in accordance with various exemplary embodiments. The intermediate stages of forming the FinFET are illustrated. The variations of the FinFETs and the formation methods are discussed. Throughout the various views and illustrative embodiments, like reference numbers are used to designate like elements.

Figure 1:
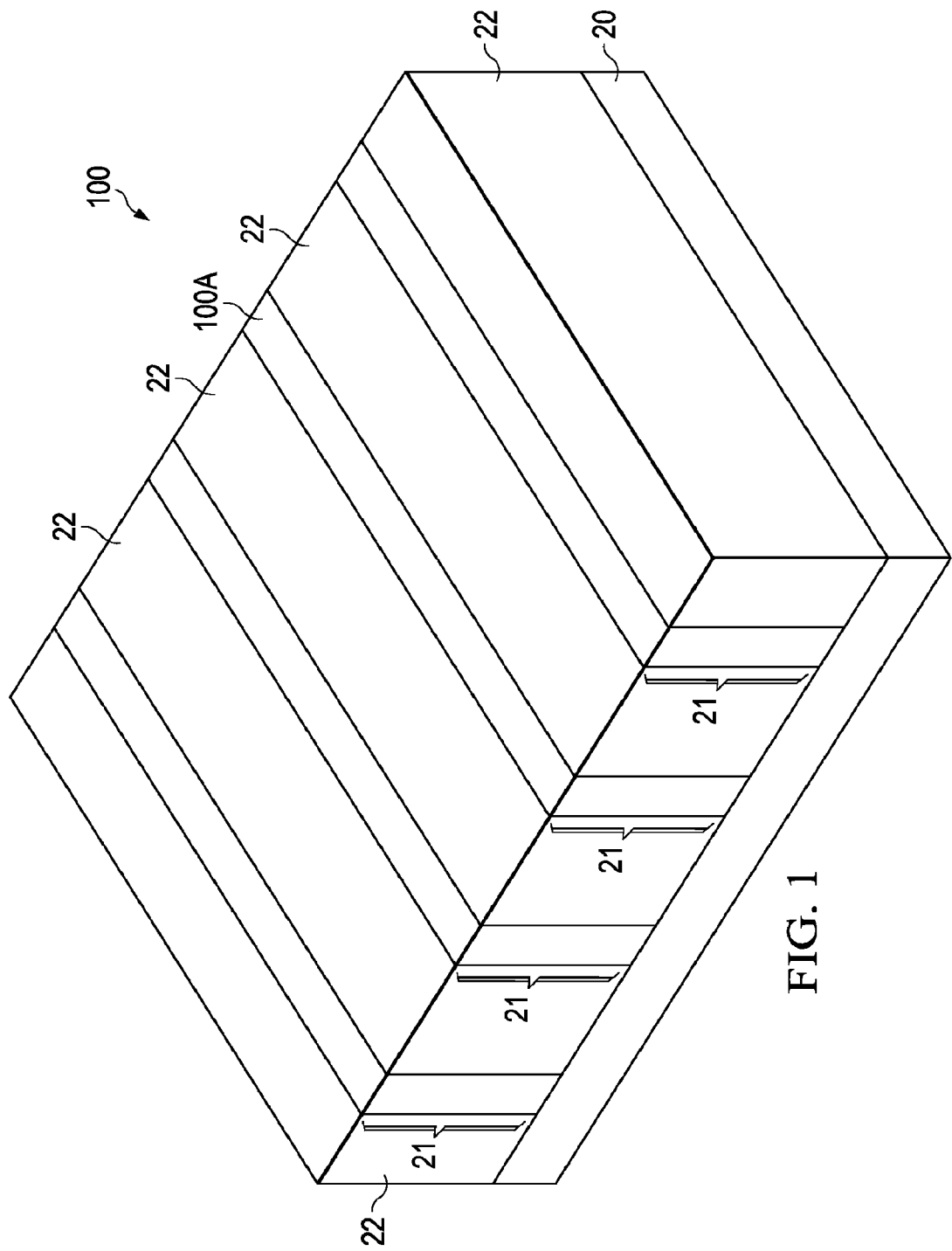
FIGS. 1 through 13C are perspective views and cross-sectional views of intermediate stages in the manufacturing of a Fin Field-Effect transistor (FinFET) in accordance with some exemplary embodiments.

FIGS. 1 through 13C are perspective views and cross-sectional views of intermediate stages in the manufacturing of a FinFET in accordance with some exemplary embodiments. FIG. 1 illustrates a perspective view of an initial structure. The initial structure includes wafer 100 having substrate 20. Substrate 20 may be semiconductor substrate, which may further be a silicon substrate, a silicon germanium substrate, a germanium substrate, or a substrate formed of other semiconductor materials. Substrate 20 may be doped with a p-type or an n-type impurity. Isolation regions such as Shallow Trench Isolation (STI) regions 22 may be formed to extend from a top surface of substrate 20 into substrate 20, wherein the top surface of substrate 20 is a major surface 100A of wafer 100. The portions of substrate 20 between neighboring STI regions 22 are referred to as semiconductor strips 21. The top surfaces of semiconductor strips 21 and the top surfaces of STI regions 22 may be substantially level with each other. Semiconductor strips 21 may be expressed as $Si_{(1-y)}Ge_y$, wherein value y is the germanium atomic percentage in semiconductor strips 21. Atomic percentage y may be any value between, and including, 0 and 1.

Figure 2:
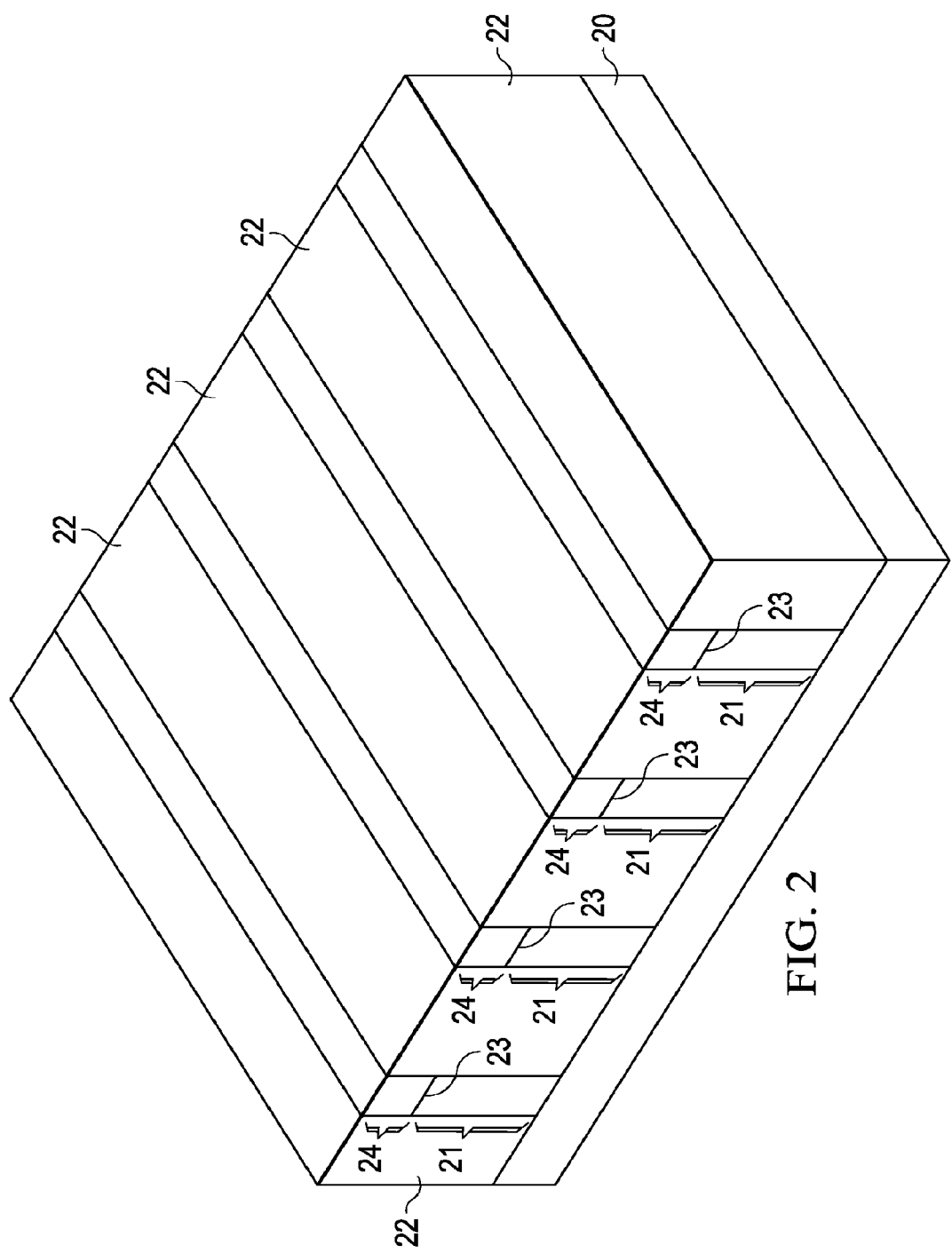

FIG. 2 illustrates the replacement of the top portions of semiconductor strips 21 with semiconductor strips 24 in accordance with some embodiments. The upper portions of semiconductor strips 21 are removed to form recesses (not shown, filled by epitaxy semiconductor strips 24). Next, an epitaxy is performed to epitaxially grow semiconductor strips 24 in the recesses, forming the structure in FIG. 2. Semiconductor strips 21 and 24 have interfaces 23. Each of semiconductor strip 21 and its respective overlying semiconductor strip 24 in combination are referred to as a (composite) semiconductor strip, with the semiconductor strips 21 and 24 referred to as a lower portion and an upper portion, respectively, of the composite strip. Semiconductor strips 24 may have a germanium atomic percentage greater than or smaller than the germanium atomic percentage of semiconductor strips 21. In some embodiments, semiconductor strips 24 comprise silicon and/or germanium, and is expressed as $Si_{(1-x)}Ge_x$, wherein value x is the atomic percentage in semiconductor strips 21. Atomic percentage x may be any value between, and including, 0 and 1. Atomic percentage x may be greater than or smaller than atomic percentage y.

The silicon germanium in semiconductor strips 24 may have a germanium atomic percentage higher than about 10 percent, or between about 15 percent and about 60 percent. The germanium atomic percentage may also be higher than 60 percent, and semiconductor strips 24 may be pure germanium strips or substantially pure germanium strips with a germanium atomic percentage higher than, for example, about 95 percent.

During the epitaxy of semiconductor strips 24, an n-type or p-type impurity may be in-situ doped with the proceeding or the epitaxy. STI regions 22 are then recessed, so that top portions of semiconductor strips 24 are higher than the top surfaces of STI regions 22 to form semiconductor fins 24'. The resulting structure is shown in FIG. 3.

Figure 3:
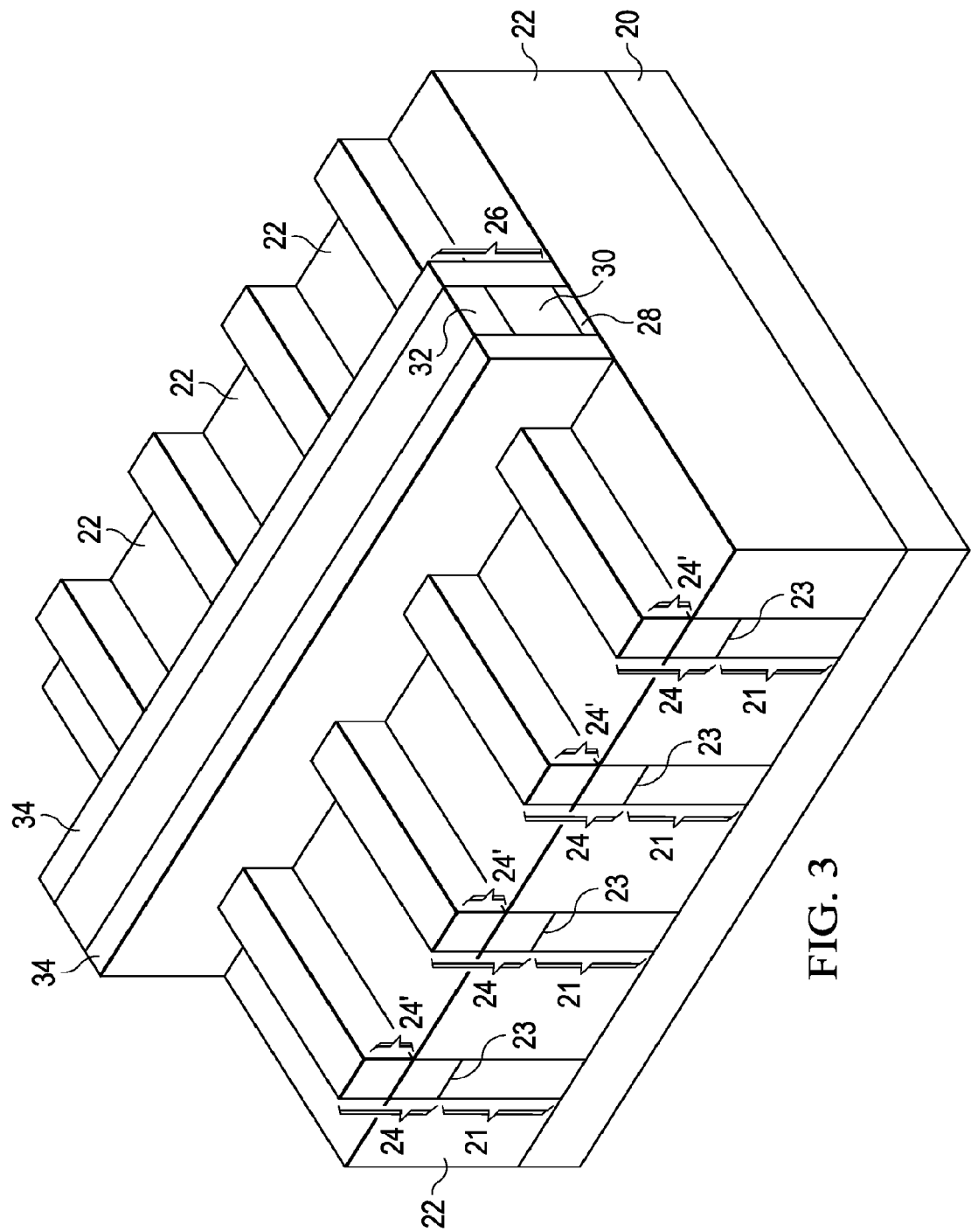

FIG. 3 further illustrates the formation of gate stack 26 on the top surface and the sidewalls of semiconductor fins 24'. Gate stack 26 includes dummy oxide layer 28, and dummy gate 30 over dummy oxide layer 28. Dummy gate 30 may be formed, for example, using polysilicon, and other materials such as metal silicides, metal nitrides, or the like, may also be used. Gate stack 26 may also comprise hard mask layer 32 over dummy gate 30, wherein the hard mask layer 32 may include silicon nitride, for example. Gate stack 26 crosses over a plurality of semiconductor fins 24' and/or STI regions 22 in some embodiments. Gate stack 26 may also have a lengthwise direction substantially perpendicular to the lengthwise direction of semiconductor fins 24'.

Next, as also shown in FIG. 3, gate spacers 34 are formed on the sidewalls of gate stack 26. In some embodiments, gate spacers 34 comprise silicon oxide, silicon nitride, or the like, and may have a multi-layer structure, for example, with a silicon nitride layer over a silicon oxide layer.

Figure 4:
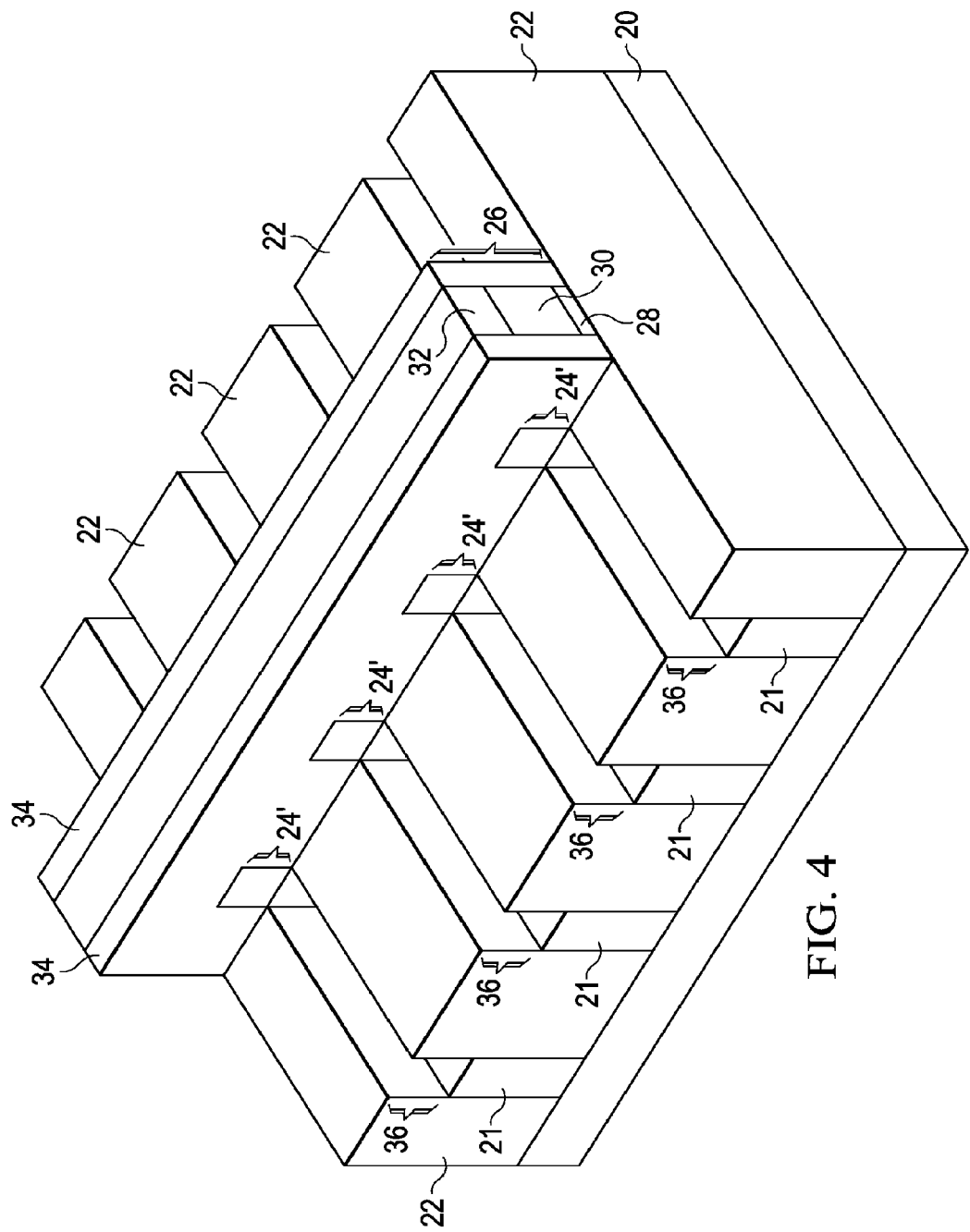

Referring to FIG. 4, an etching step is performed to etch portions of semiconductor fins 24' that are not covered by gate stack 26 and gate spacers 34. Recesses 36 are accordingly formed between STI regions 22. Recesses 36 are located on the opposite sides of gate stack 26.

Figure 5:
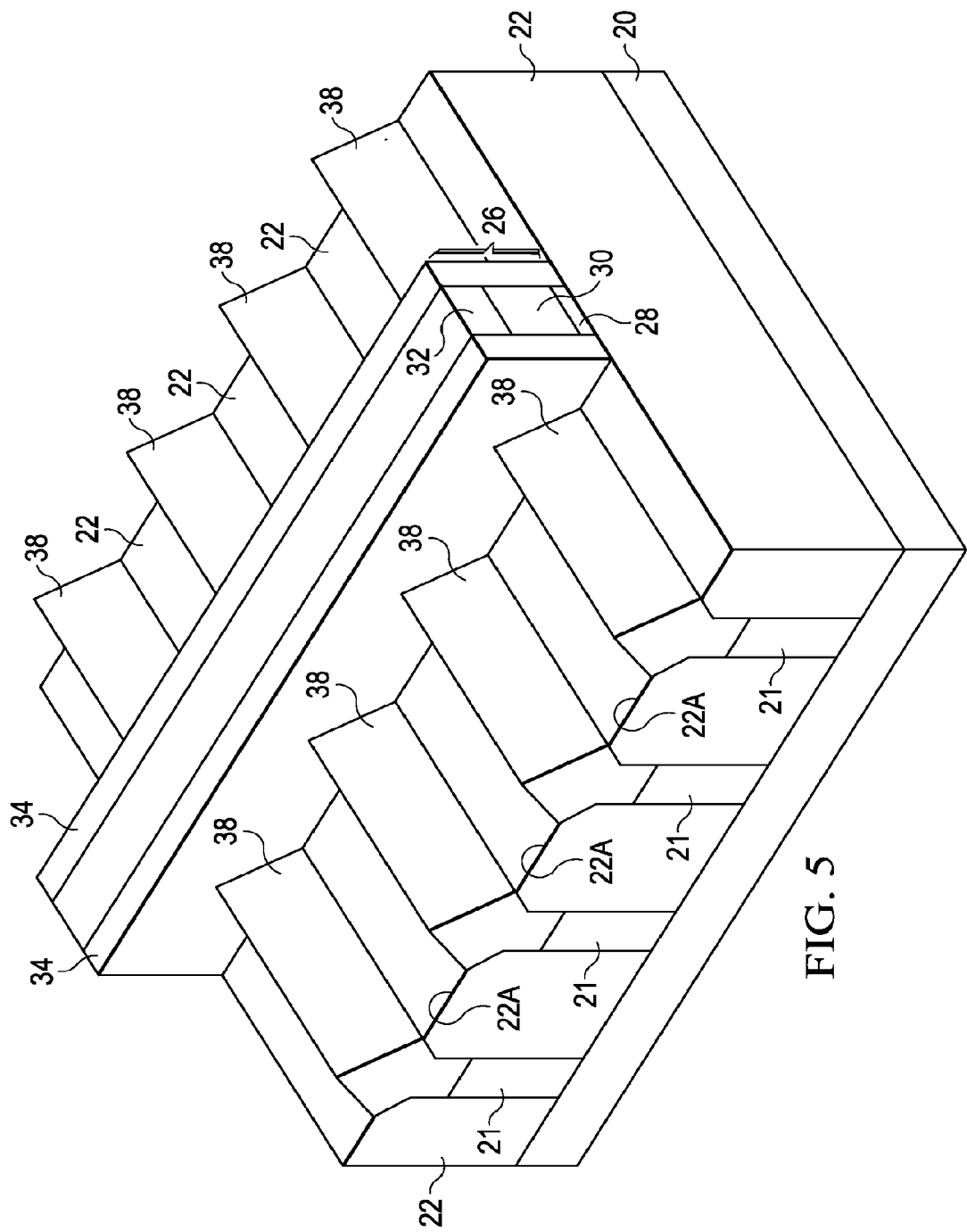

Next, as shown in FIG. 5, epitaxy regions 38 are formed by selectively growing a semiconductor material in recesses 36. In some exemplary embodiments, epitaxy regions 38 comprise silicon (with no germanium), germanium (with no silicon), silicon germanium, silicon phosphorous, or the like. Epitaxy regions 38 may also be formed of pure or substantially pure germanium, for example, with a germanium atomic percentage greater than about 95 percent. After recesses 36 are filled with epitaxy regions 38, the further epitaxial growth of epitaxy regions 38 causes epitaxy regions 38 to expand horizontally, and facets start to form. Furthermore, some of top surfaces 22A of STI regions 22 are underlying and aligned to portions of epitaxy regions 38 due to the lateral growth of epitaxy regions 38.

After the epitaxy step, epitaxy regions 38 may be implanted to form source and drain regions, which are also denoted using reference numeral 38. Alternatively, the p-type or n-type impurity may be in-situ doped when epitaxy regions 38 are grown to form source and drain regions. Source and drain regions 38 are on the opposite sides of gate stack 26, and may be overlying and overlapping portions of surfaces 22A of STI regions 22.

Figure 6A:
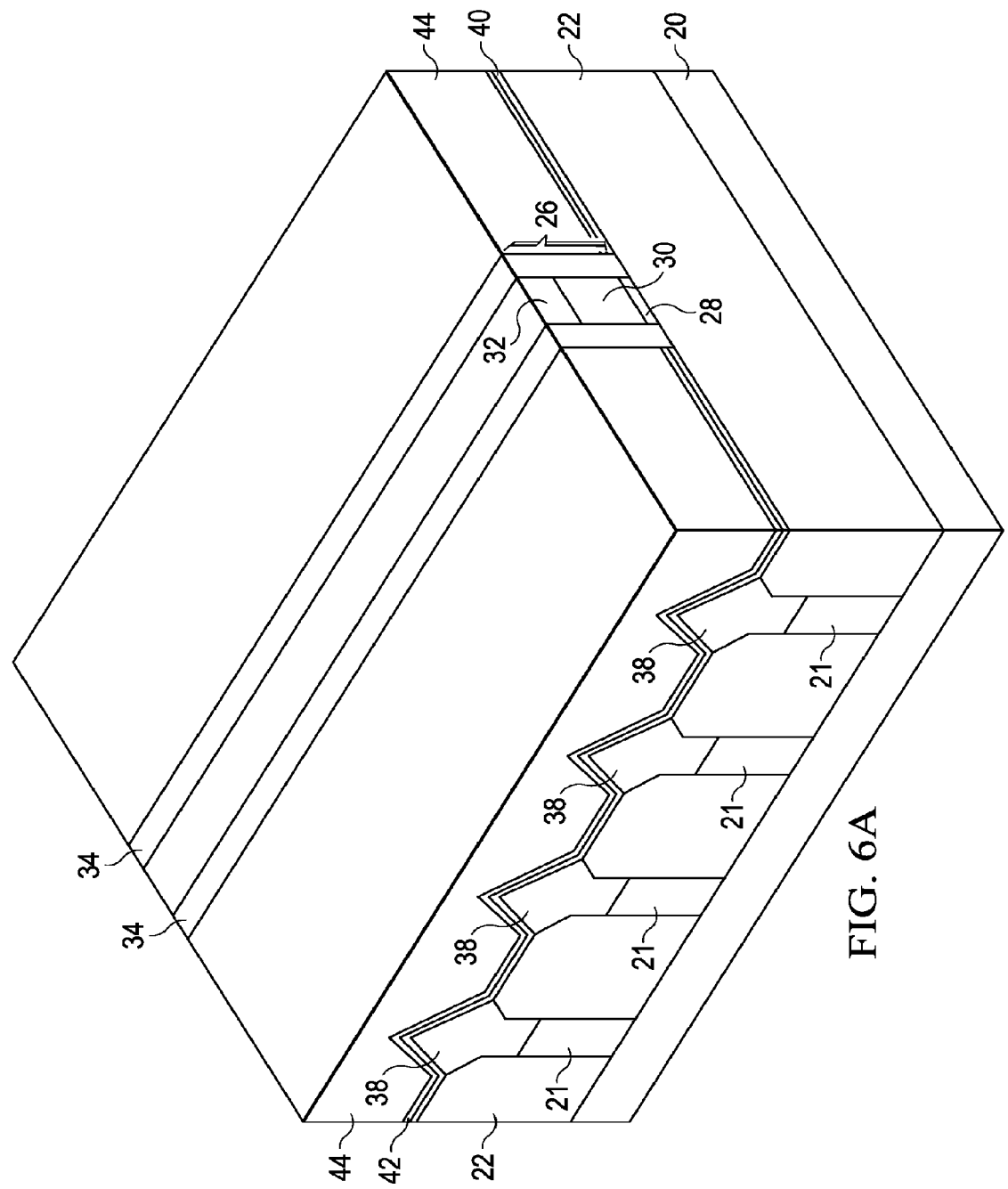

FIG. 6A illustrates a perspective view of the structure after buffer oxide layer 40, Contact Etch Stop Layer (CESL) 42, and Inter-Layer Dielectric (ILD) 44 are formed. In some embodiments, buffer oxide layer 40 comprises silicon oxide, and CESL 42 comprises silicon nitride, silicon carbonitride, or the like. Buffer oxide layer 40 and CESL 42 may be formed using Atomic Layer Deposition (ALD), for example. ILD 44 may comprise Flowable oxide formed using, for example Flowable Chemical Vapor Deposition (FCVD). A Chemical Mechanical Polish (CMP) may be performed to level the top surfaces of ILD 44, gate stack 26, and gate spacers 34 with each other. Although not shown in detail in FIG. 6A, buffer oxide layer 40 and CESL 42 may extend on the sidewalls of gate spacers 34 and the top surfaces of gate spacers 34 and gate stack 26, as illustrated in FIG. 6B.

Figure 6B:
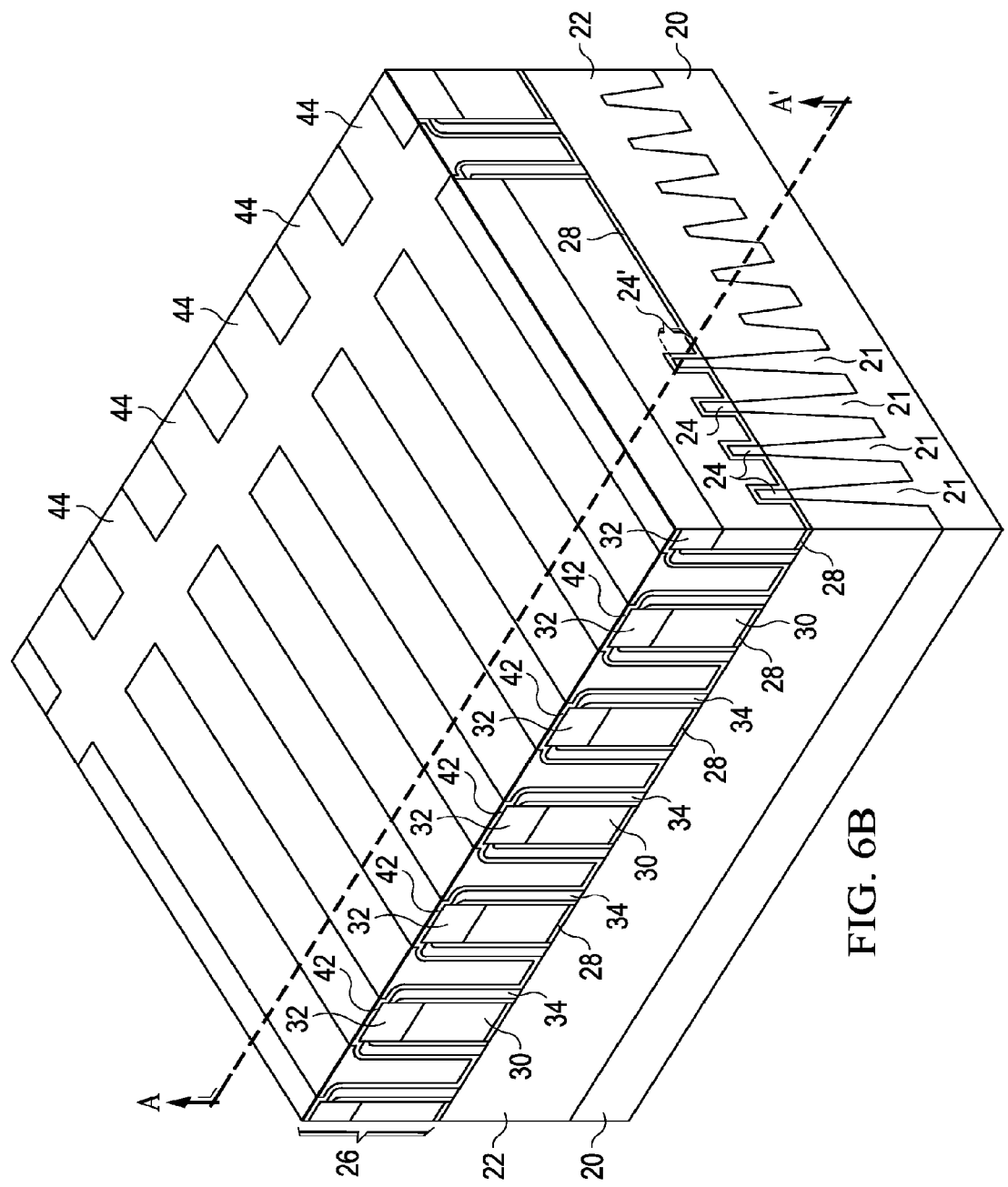
Figure 6C:
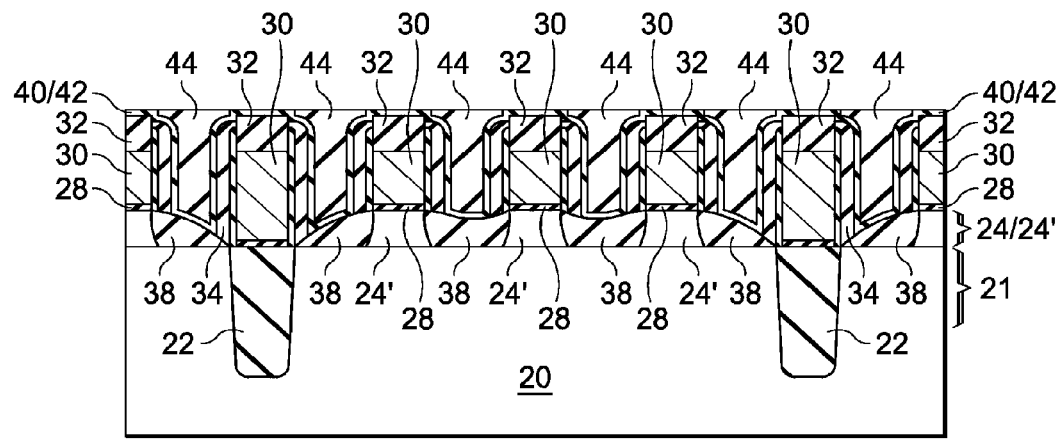

FIG. 6B illustrates the structure in FIG. 6A from another angle. In FIG. 6B, an illustrated plane cuts through the lengthwise direction of one of gate stacks 26, so that the portion of semiconductor strips 21 and 24 and semiconductor fins 24' are revealed. FIG. 6B illustrates a plurality of gate stacks 26 crossing over a plurality of semiconductor fins 24', wherein ILD 44 fills the space between gate stacks 26 and spacers 34. FIG. 6C illustrates a cross-sectional view obtained from the vertical plan crossing line A-A' in FIG. 6B, wherein the vertical plan cuts through, and extends in the lengthwise direction of, one of fins 24'.

Figure 7B:
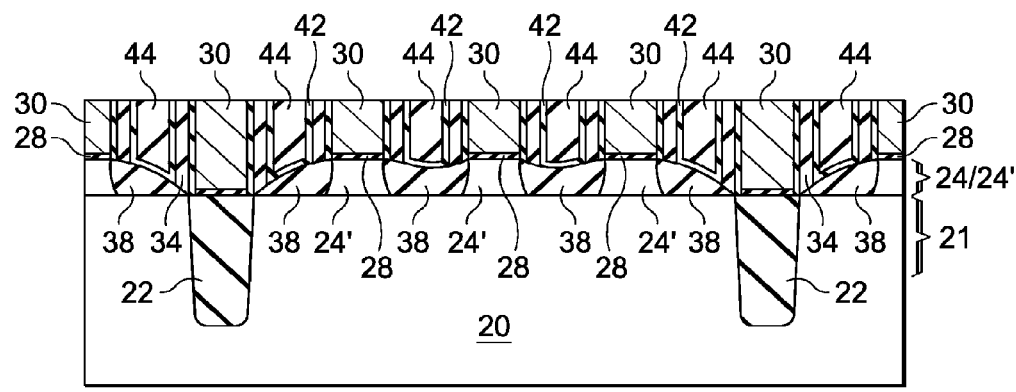
Figure 7A:
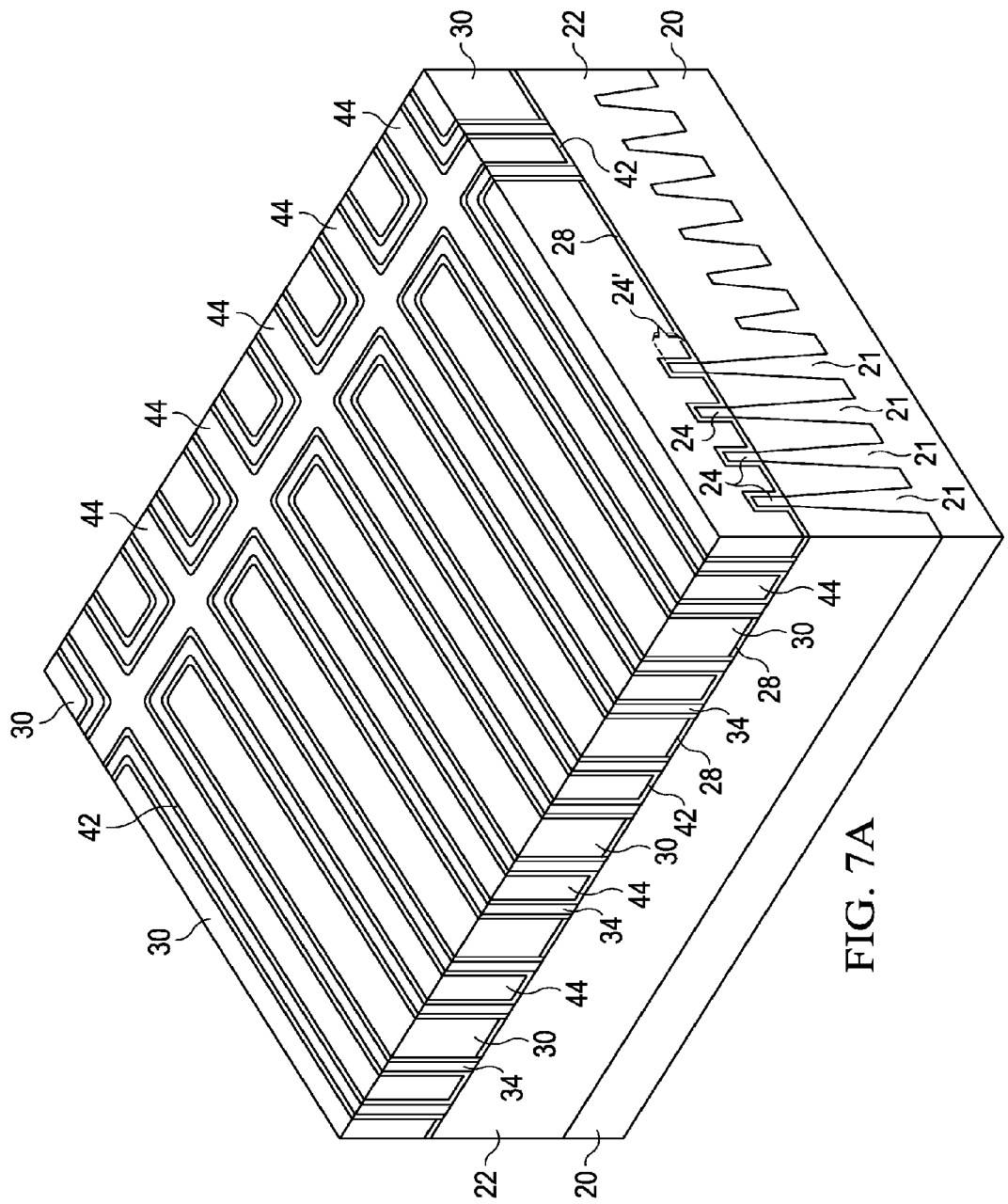

FIGS. 7A and 7B illustrate the further CMP performed on the structure in FIGS. 6A through 6C. FIGS. 7A and 7B include a perspective view and a cross-sectional view, respectively, wherein the cross-sectional view in FIG. 7B is obtained from the same plane crossing line A-A' in FIG. 6B. The CMP stops on the top surface of dummy gate 30. Accordingly, hard mask layer 32 (FIG. 6B) and the portions of CESL 42 and ILD 44 over the top surface of hard mask layer 32 are removed.

Figure 8A:
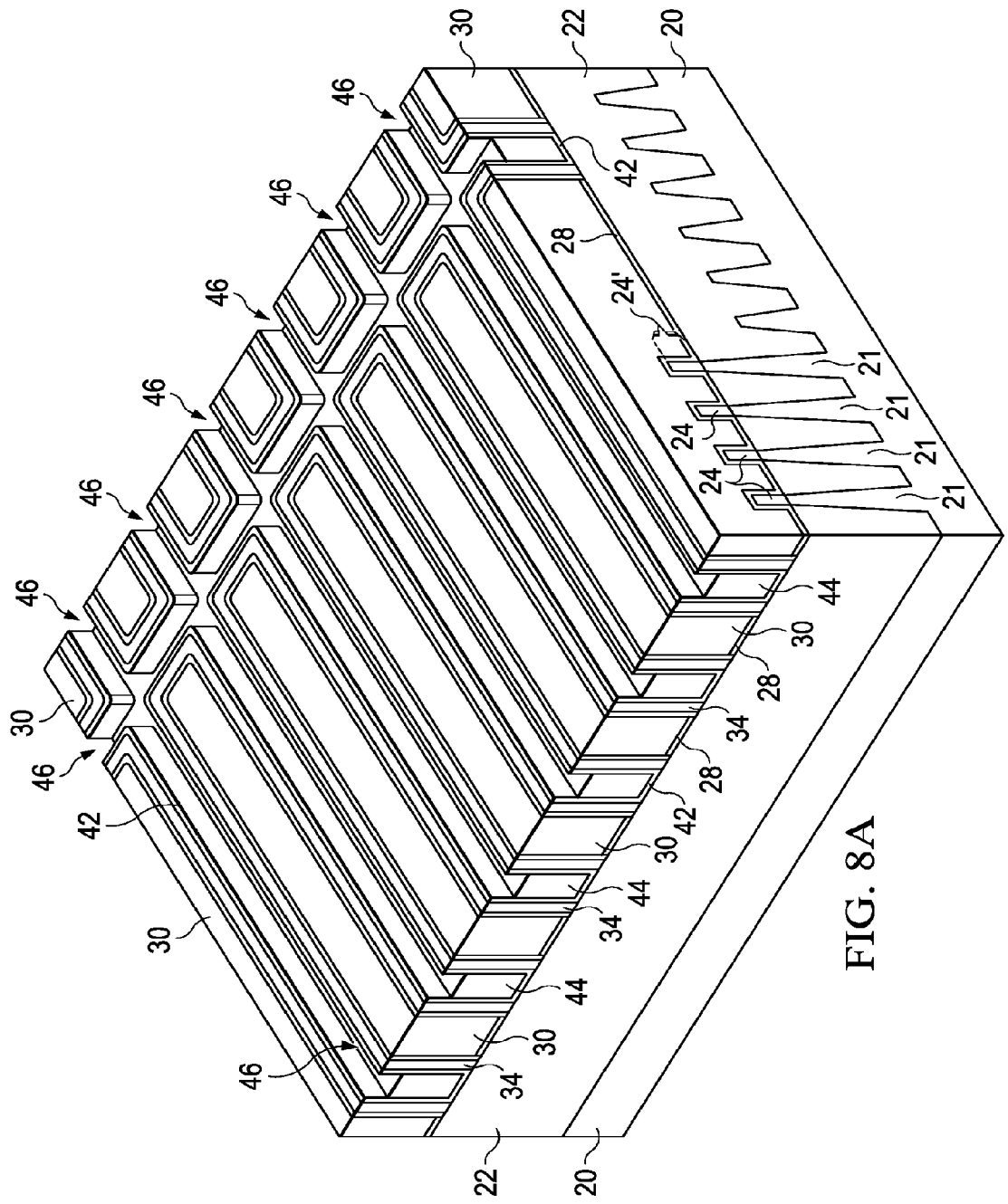
Figure 8B:
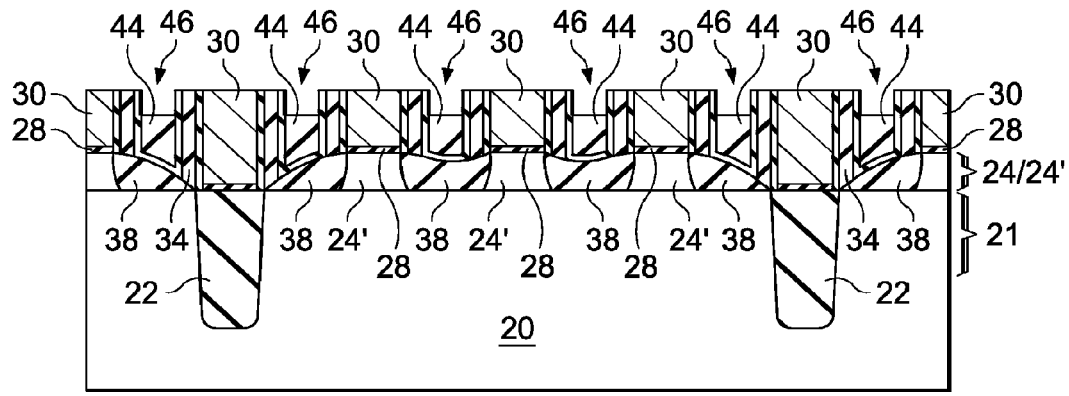

Next, referring to FIGS. 8A and 8B, an etch-back is performed on ILD 44, so that ILD 44 is recessed to a level lower than the top surface of dummy gates 30. FIGS. 8A and 8B include a perspective view and a cross-sectional view, respectively, wherein the cross-sectional view in FIG. 8B is obtained from the same plane crossing line A-A' in FIG. 6B. Dummy gates 30 are not recessed. Accordingly, recesses 46 are formed between neighboring dummy gates 30. In some embodiments, recesses 46 have depths in the range between about 5 percent and about 90 percent the height of dummy gates 30. It is appreciated, however, that the values recited throughout the description are merely examples, and may be changed to different values.

Figure 9B:
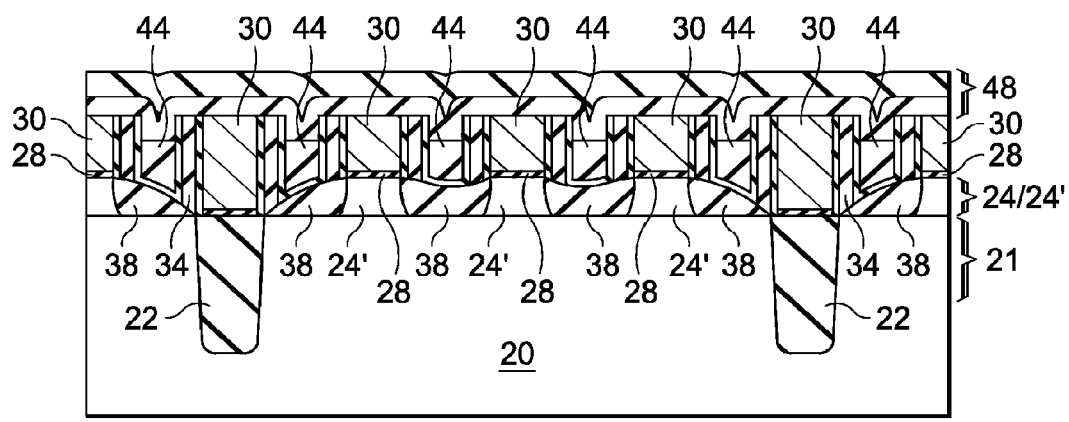
Figure 9A:
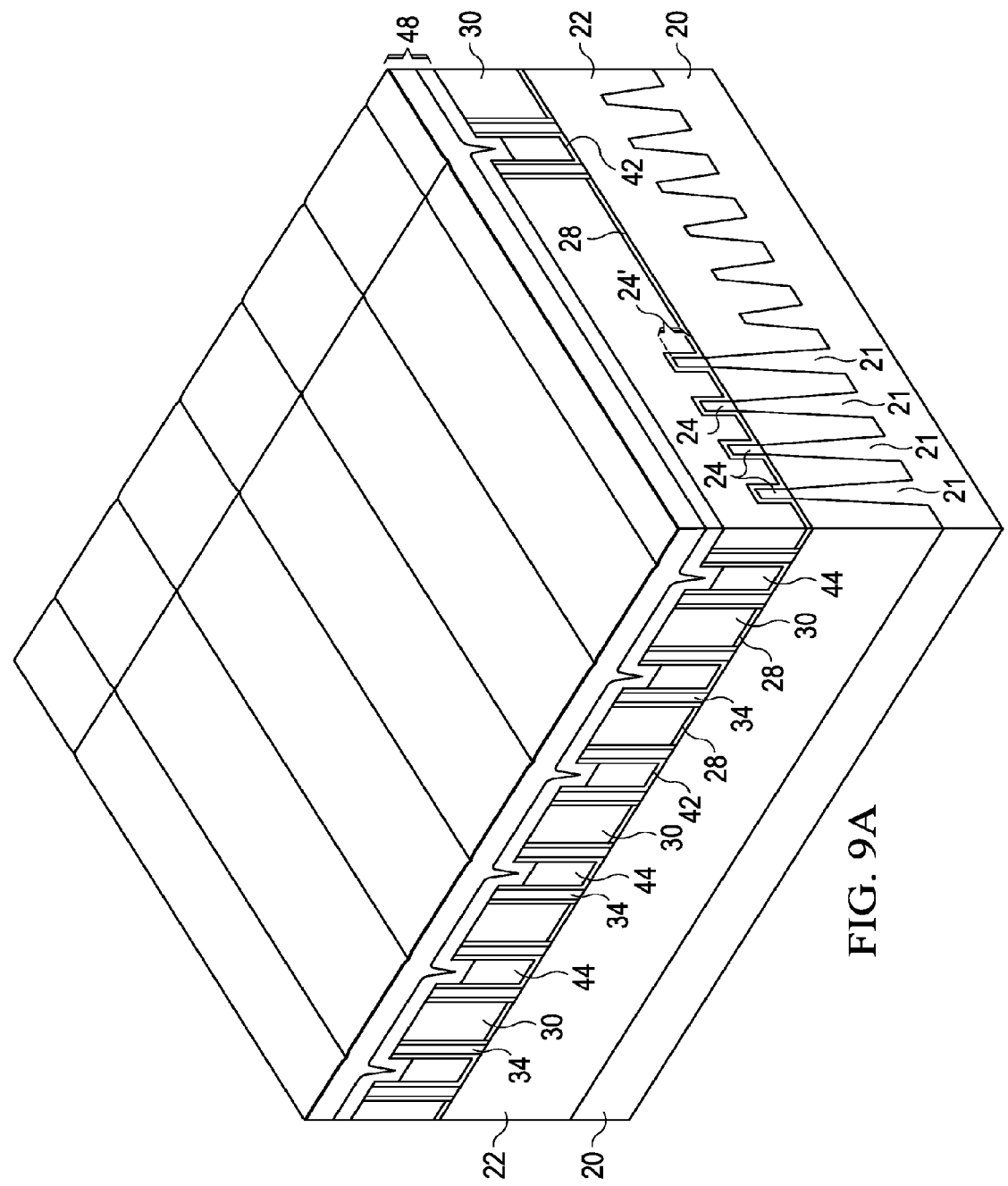

FIGS. 9A and 9B illustrate the formation of hard mask layer 48. FIGS. 9A and 9B include a perspective view and a cross-sectional view, respectively, wherein the cross-sectional view in FIG. 9B is obtained from the same plane crossing line A-A' in FIG. 6B. In some embodiments, hard mask layer 48 is formed using a Chemical Vapor deposition (CVD) method, which may be Plasma Enhance CVD (PECVD), Molecular Layer Deposition (MLD), combinations thereof, or other applicable methods. Hard mask layer 48 may include silicon nitride, for example, although other dielectric materials may be used. In some exemplary embodiments, hard mask layer 48 includes a silicon nitride layer formed of MLD, and a silicon nitride layer formed of PECVD over the MLD silicon nitride layer. Hence, hard mask layer 48 is filled into the recesses 46 (FIGS. 8A and 8B).

Figure 10A:
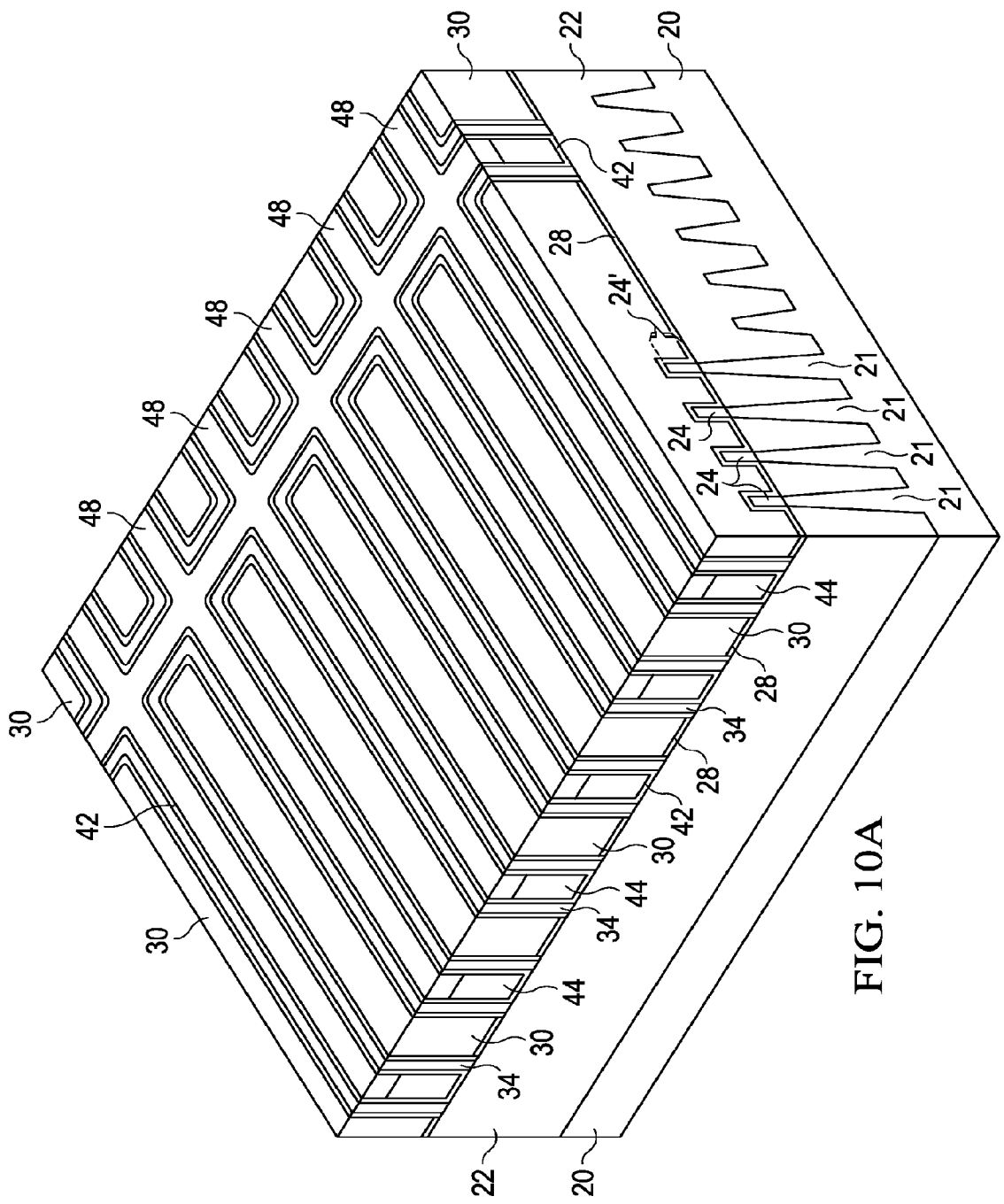
Figure 10B:
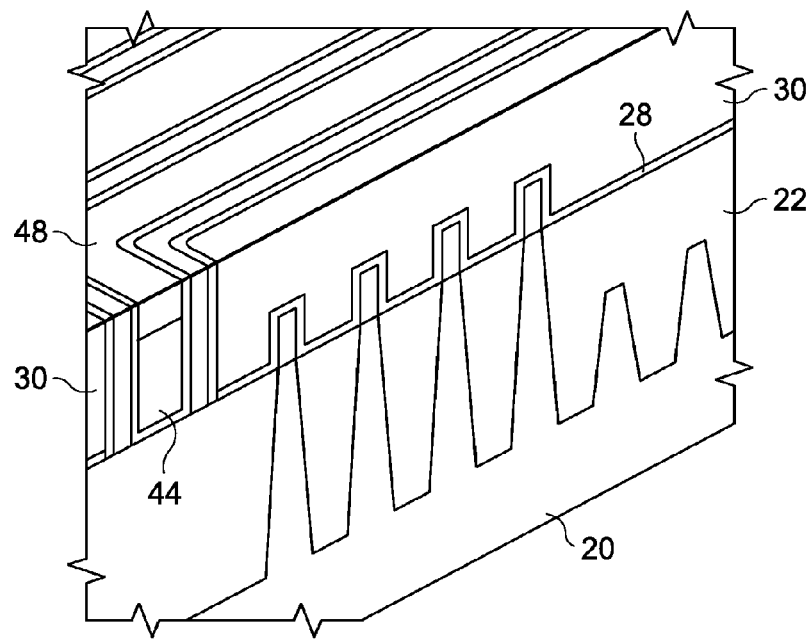
Figure 10C:
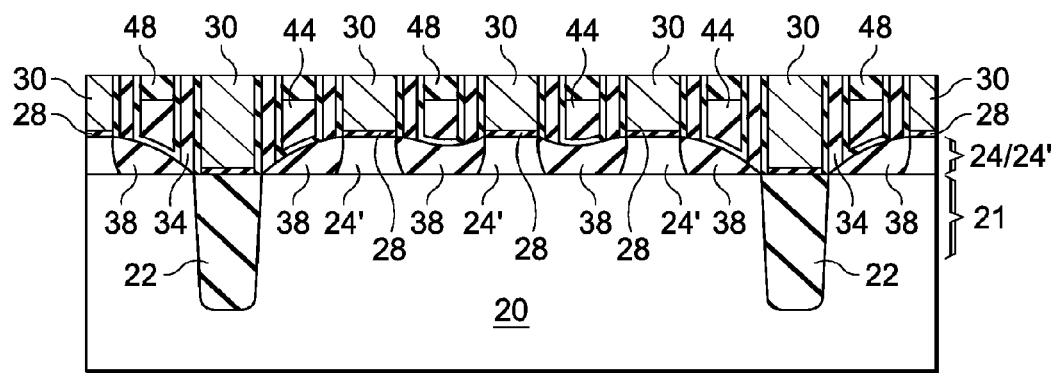

FIGS. 10A, 10B, and 10C illustrate the CMP of hard mask layer 48. FIGS. 10A and 10B are prospective views. FIG. 10C is a cross-sectional view, wherein the cross-sectional view in FIG. 10C is obtained from the same plane crossing line A-A' in FIG. 6B. The CMP is stopped on the top surfaces of dummy gates 30. Accordingly, the remaining hard mask layer 48 covers ILD 44.

Figure 11A:
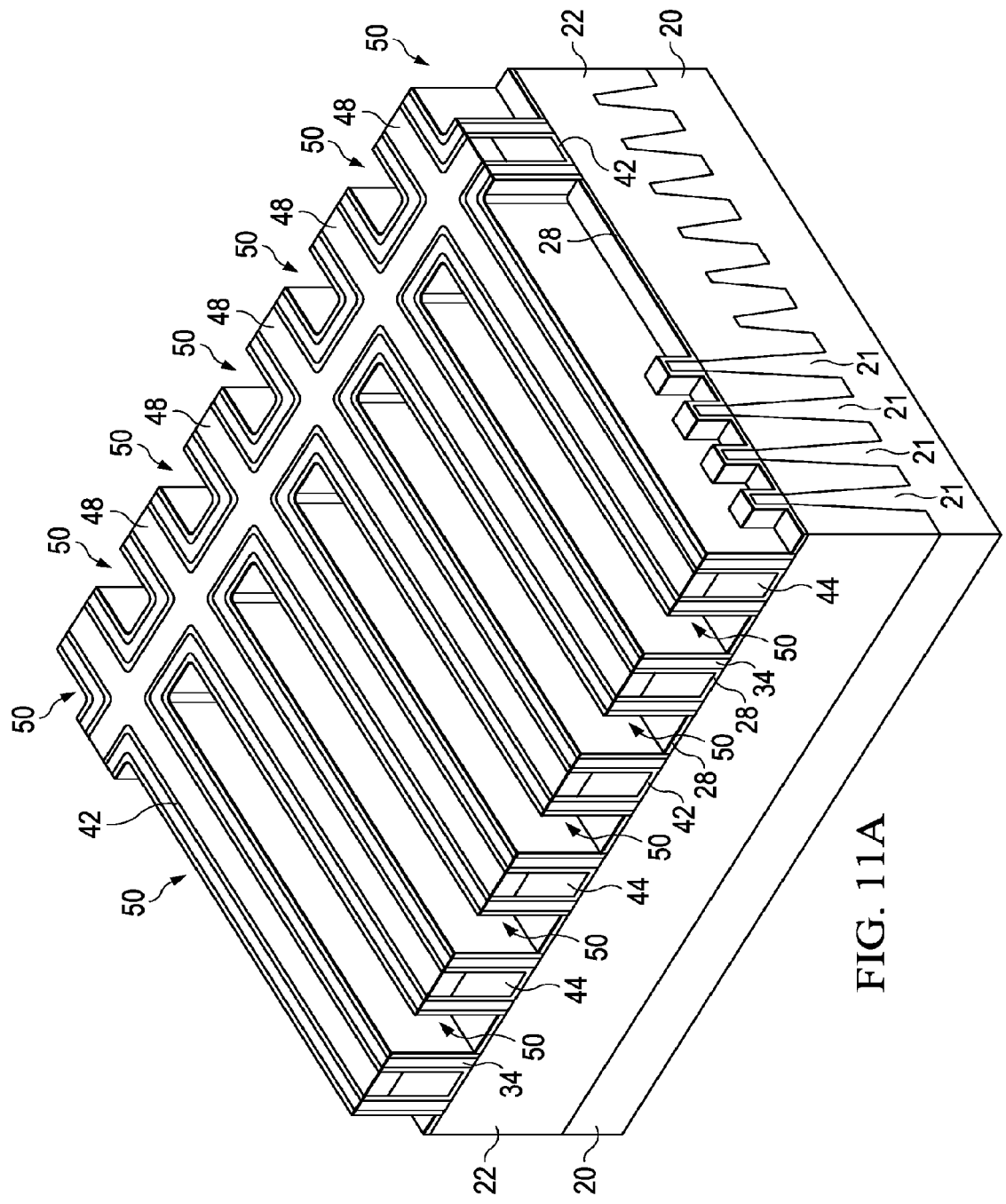
Figure 11B:
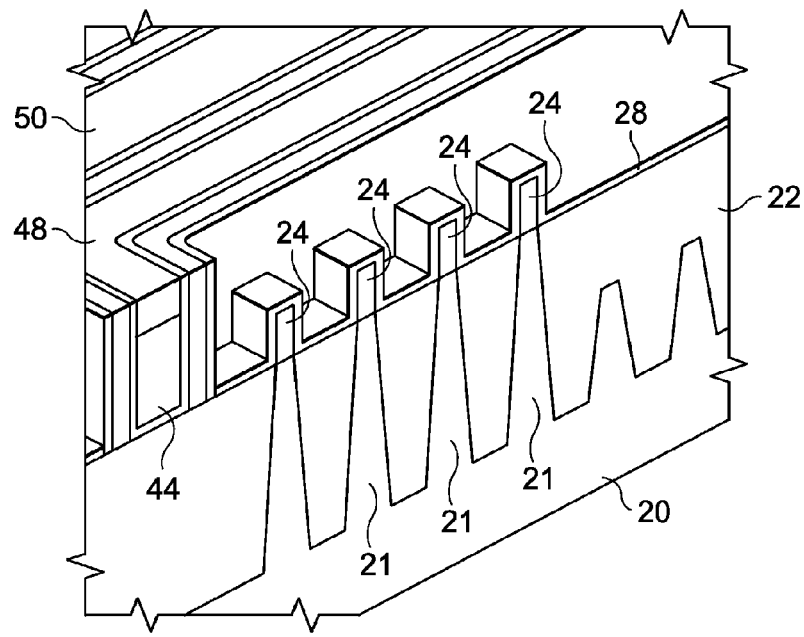
Figure 11C:
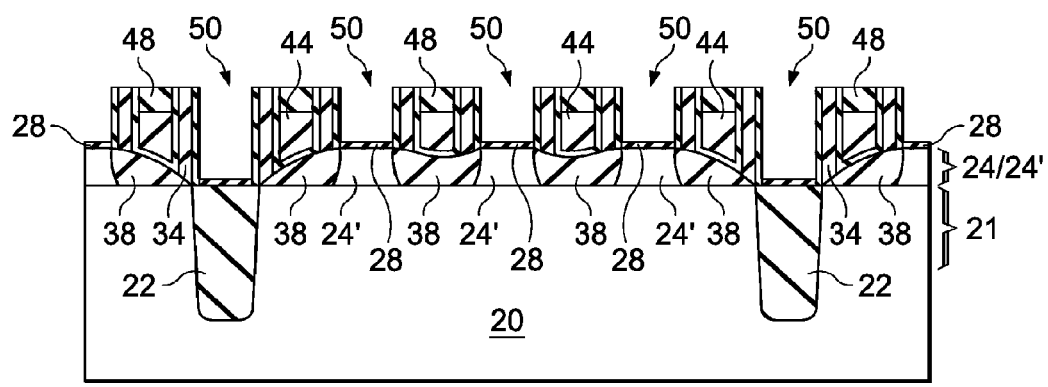

With hard mask layer 48 protecting ILD 44, dummy gates 30 are removed, as shown in FIGS. 11A, 11B, and 11C. FIGS. 11A and 11B are prospective views. FIG. 11C is a cross-sectional view, wherein the cross-sectional view in FIG. 11C is obtained from the same plane crossing line A-A' in FIG. 6B. Recesses 50 are formed due to the removal of dummy gates 30, wherein dummy oxide layers 28 (FIG. 11C) are exposed in recesses 50.

Figure 12A:
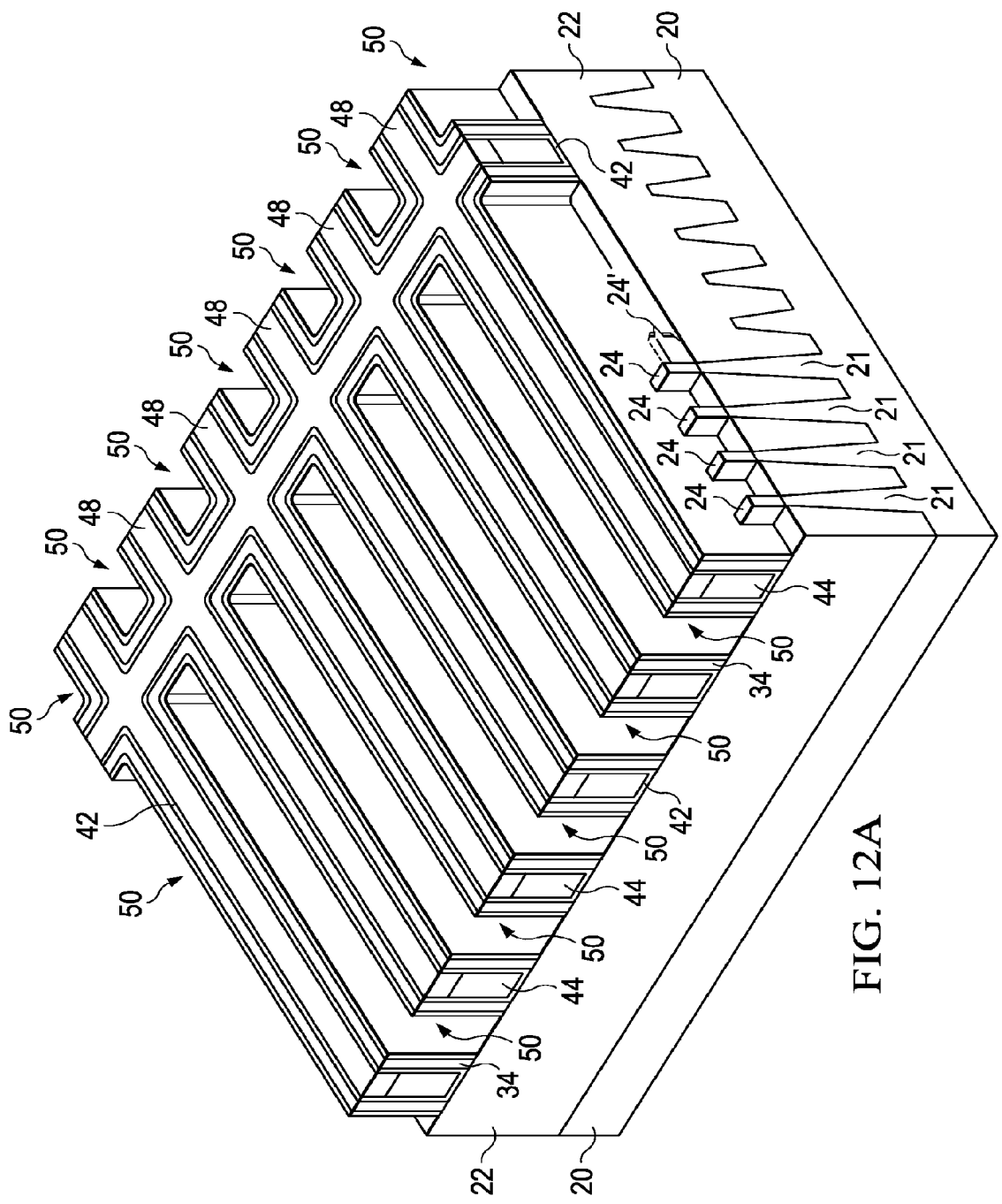
Figure 12B:
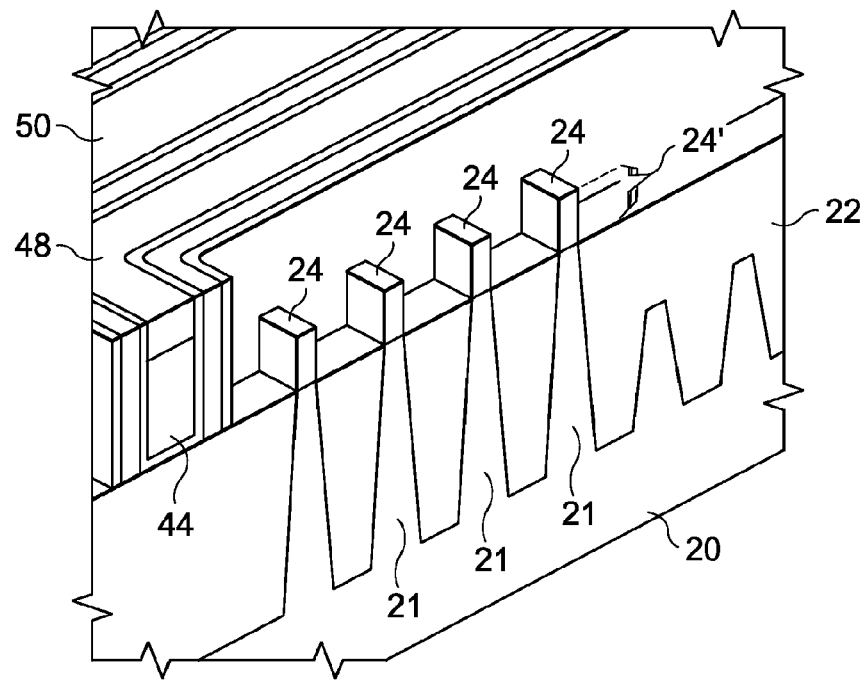
Figure 12C:
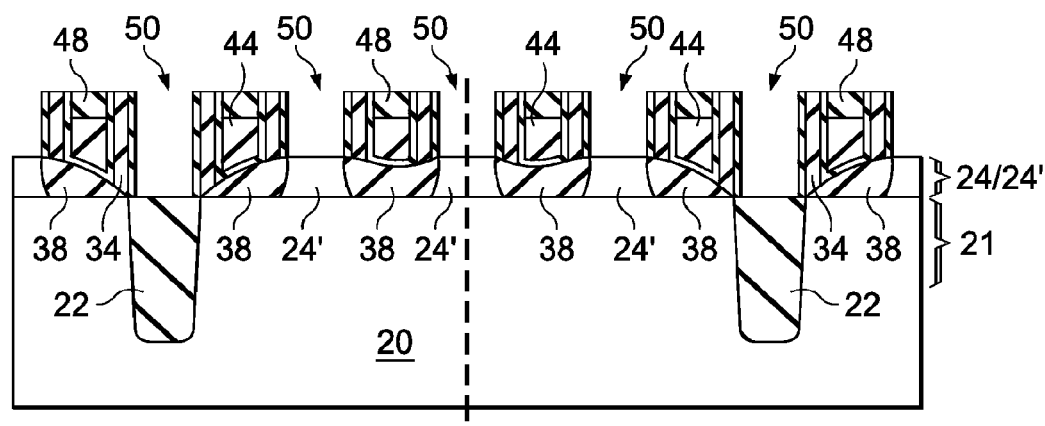

Next, dummy oxide layers 28 are removed in an etching process, and the resulting structure is shown in FIGS. 12A, 12B, and 12C. FIGS. 12A and 12B are prospective views. FIG. 12C is a cross-sectional view, wherein the cross-sectional view in FIG. 12C is obtained from the same plane crossing line A-A' in FIG. 6B. Accordingly, semiconductor fins 24' are exposed. The top surfaces of STI regions 22 are also exposed to recesses 50.

Figure 13A:
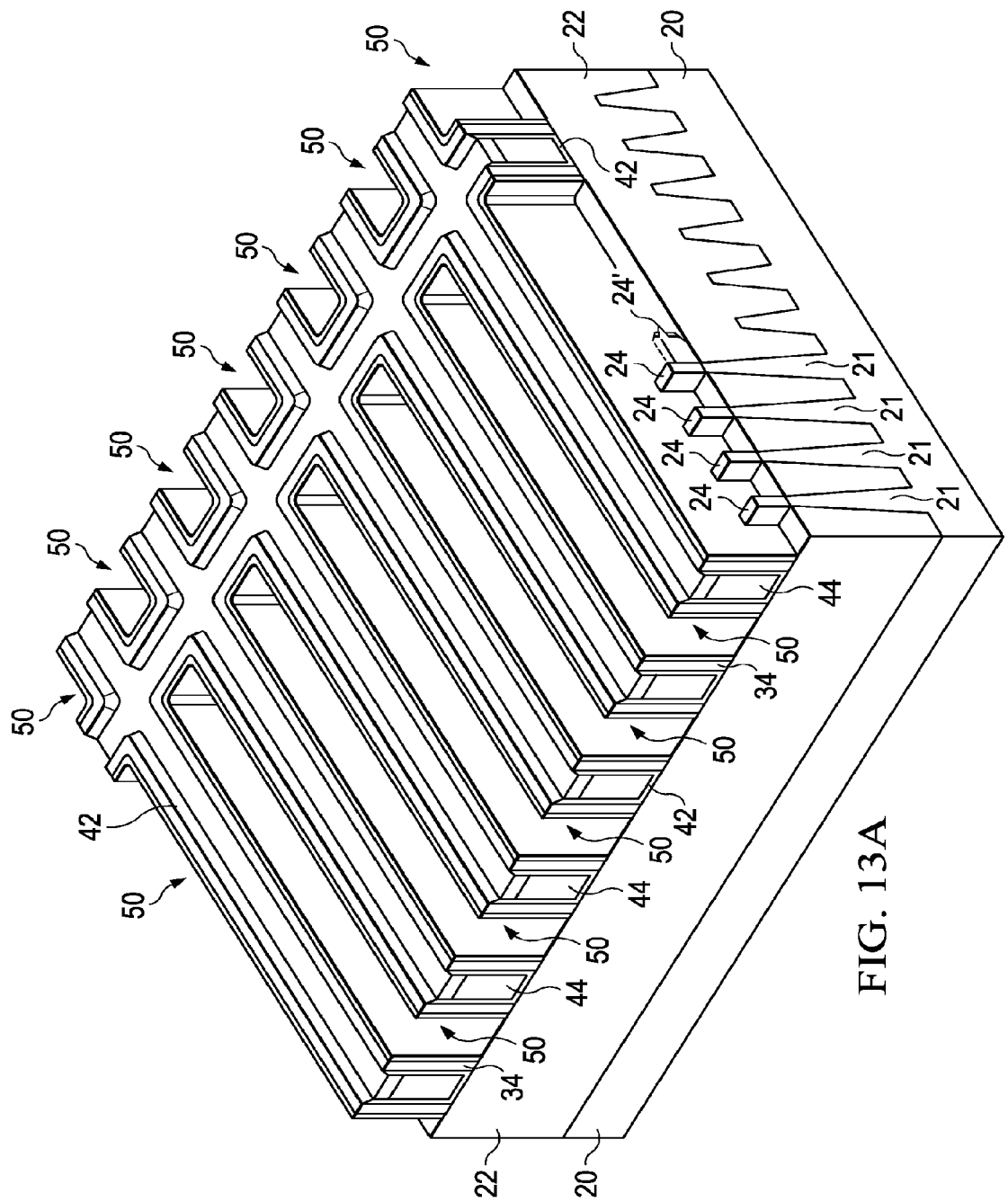
Figure 13B:
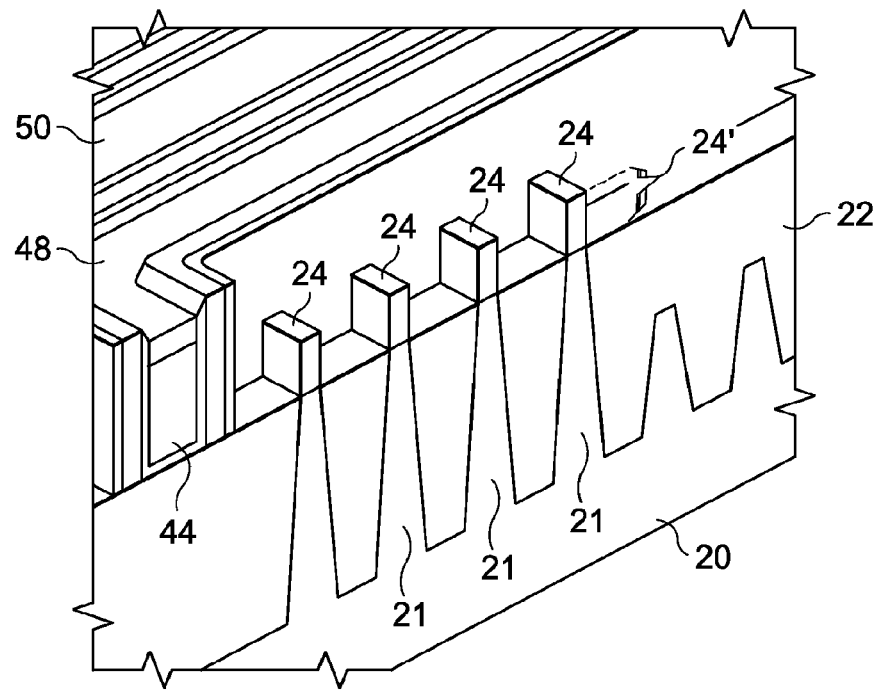
Figure 13C:
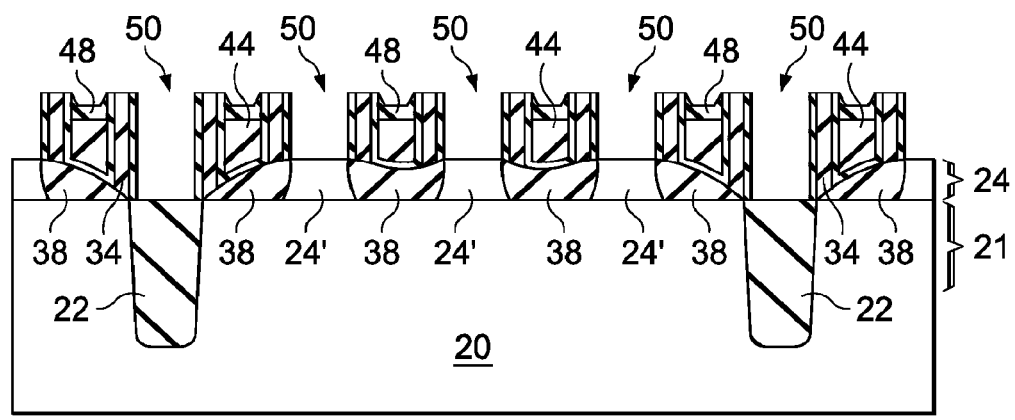

FIGS. 13A, 13B, and 13C illustrate the removal of inter-diffusion regions that are formed between semiconductor strips 21 and 24. FIGS. 13A and 13B are prospective views. FIG. 13C is a cross-sectional view, wherein the cross-sectional view in FIG. 13C is obtained from the same plane crossing line A-A' in FIG. 6B. The details in FIGS. 13A, 13B, and 13C are illustrated in FIGS. 14 through 20, as discussed in subsequent paragraphs. FIGS. 14 through 20 illustrate cross-sectional views, which are obtained from the plan crossing line B-B' in FIG. 13B.

Figure 14:
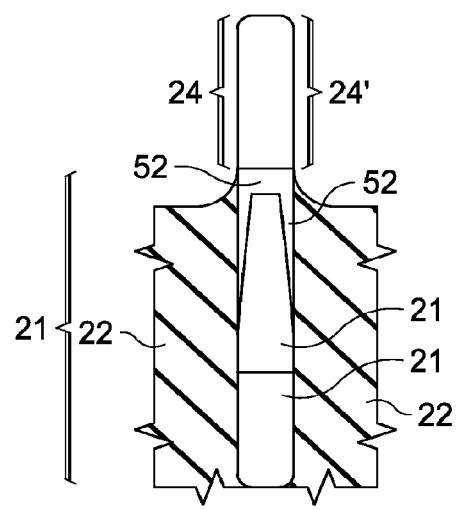
FIGS. 14 through 20 are cross-sectional views in the removing of inter-diffused regions in semiconductor fins in accordance with some exemplary embodiments.

Referring to FIG. 14, semiconductor strip 21 and the overlying semiconductor strip 24 are illustrated. Since semiconductor strip 24 is grown from semiconductor strip 21, semiconductor strip 24 is in contact with semiconductor strip 21. After the formation of semiconductor strip 24, some processes involving elevated temperatures are involved, and hence the atoms in semiconductor strip 24 and semiconductor strip 21 diffuse to each other to form inter-diffused regions 52. In the illustrated embodiments, semiconductor strip 24 has a germanium percentage higher than the germanium percentage of semiconductor strip 21, and hence from top to bottom, inter-diffused regions 52 have increasingly reduced width. As shown in FIG. 14, inter-diffused regions 52 may extend downwardly to surround a portion of semiconductor strip 21.

Figure 15:
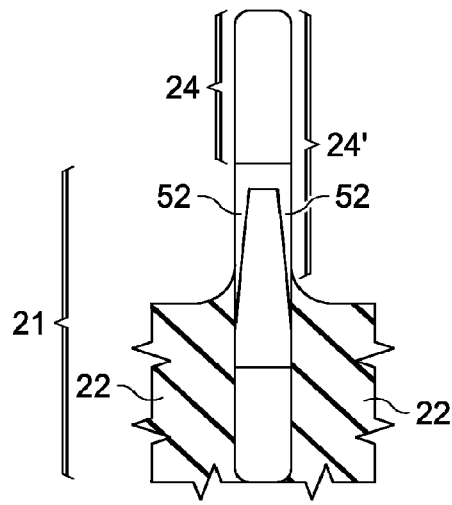

Referring to FIG. 15, STI regions 22 are etched, so that the top surfaces of STI regions 22 are lowered. As a result, inter-diffused regions 52 are exposed. In some embodiments, after the recessing of STI regions 22, the top surfaces of STI regions 22 are substantially level with or lower than the bottoms of inter-diffused regions 52. The recessing of STI regions 22 may include a dry etching using a fluorine-containing gas, a chlorine-containing gas, or the like. In some embodiments, the recessing of STI regions 22 is performed using a process gas elected from HBr, HCl, HF, $NH_3$, CxHy (which may be $C_4H_6$, $C_4H_8$, or the like), or combinations thereof. Alternatively, the etching may be a wet etch using, for example, an HCl solution, an HF solution, or the like. In yet alternative embodiments, the etch is performed using a dry etch step and a wet etch step. The etching may be performed using Inductively Coupled Plasma (ICP), Transformer Coupled Plasma (TCP), Electron Cyclotron Resonance (ECR), Reactive Ion Etch (RIE), or the like.

Figure 16:
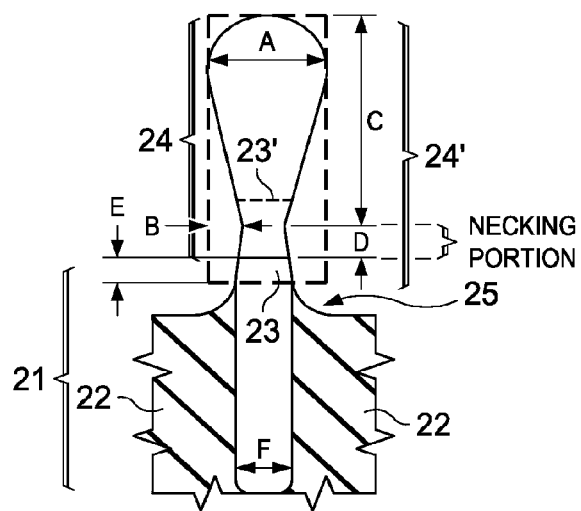

Next, referring to FIG. 16, the inter-diffused regions 52 in FIG. 15 are etched, resulting in a club-shaped fin 24' including a necking portion, which is the portion having a reduced width than the overlaying and underlying portions. The removal of inter-diffused regions 52 may be performed using an etchant that etches germanium slower than etching silicon. FIG. 23 illustrates a schematic graph shown the etching rate (of inter-diffused regions 52 and semiconductor strips 21 and 24) as a function of the germanium atomic percentages in the respective regions. As shown in FIG. 23, in a certain range of germanium atomic percentage, with the increase in germanium atomic percentage, the etching rate reduces. Accordingly, inter-diffused regions 52 are etched faster than semiconductor strip 24 (which has a higher germanium atomic percentage than inter-diffused regions 52) in some embodiments.

In some embodiments, the etching as shown in FIG. 16 is performed using wet etching, in which a $NH_4OH$ solution, an $H_2O_2$ solution, an HCl solution, or an HF solution is used as an etchant. For example, the $NH_4OH$ solution may have a weight percentage between about 0.003 percent and about 30 percent, the $H_2O_2$ solution may have a weight percentage between about 0.003 percent and about 30 percent, the HCl solution may have a weight percentage between about 0.0038 percent and about 38 percent, and the HF solution may have a weight percentage between about 0.01 percent and about 70 percent. In alternative embodiments, a dry etch method is used, wherein HF, CxHy (which may be $C_4H_6$, $C_4H_8$, or the like), or combinations thereof may be used as the etchant gas. In yet alternative embodiments, Ammonia peroxide mixture (APM), Sulfuric acid peroxide mixture (SPM), Hydrochloric acid peroxide mixture (HPM), $H_2O_2$, $O_3$, or the like, may be used as an etchant to perform the etching. The etching may be performed using ICP, TCP, ECR, RIE, or the like.

Some exemplary values of the structure in FIG. 16 are provided below. For example, the necking distance B, which is the recessing distance of the necking portion compared to the widest overlying portion of fin 24', may be about 1 nm and about 7 nm. Alternatively stated, the width of the widest overlying portion of fin 24' is greater than the width of the necking portion by a difference between about 2 nm and about 14 nm. The greatest width A of fin 24' may be between about 6 nm and about 22 nm. The vertical distance C, which is the distance from the necking portion to the top of fin 24', may be between about 8 nm and about 60 nm. The distance from the necking portion to the interface 23 between semiconductor strips 21 and 24 may be smaller than about 10 nm. Furthermore, the necking portion may be over interface 23 or under interface 23 (wherein the respective interface is marked as 23'). The vertical distance E, which is the distance from the necking portion to point 25, which is wherein STI region 22 joins fin 24', may be smaller about 8 nm. The width F of semiconductor strip 21 may be between about 6 nm and about 22 nm.

Figure 17:
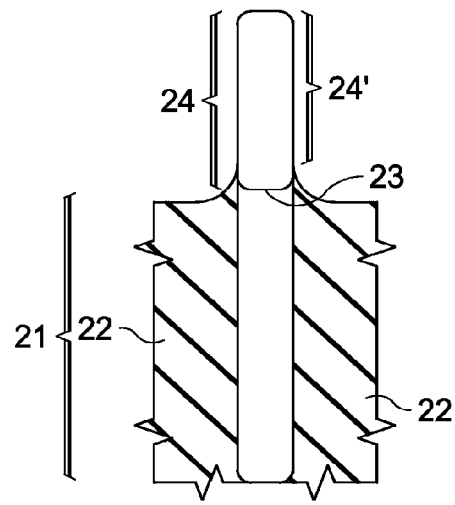
Figure 18:
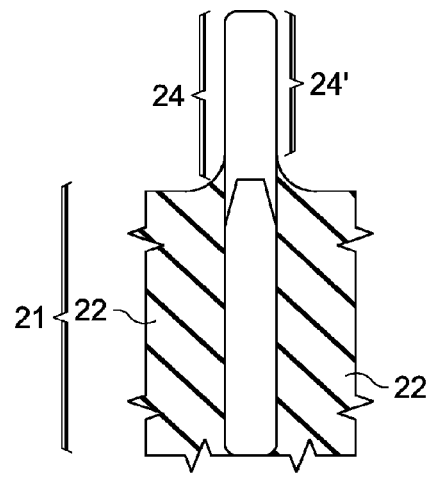

FIGS. 17 through 20 illustrate the details of the process step that is shown in FIGS. 13A through 13C in accordance with alternative embodiments. These embodiments are similar to the embodiments in FIGS. 14 through 16, except that an additional anneal is performed, so that the structure in FIG. 18 may be formed starting from the structure in FIG. 17. In these embodiments, there is not enough inter-diffusion occurring to semiconductor strips 21 and 24, as shown in FIG. 17. According, after the process step as shown in FIGS. 12A through 12C, an anneal is performed to form inter-diffused regions 52, as shown in FIG. 18. The anneal may be a thermal anneal, for example, at a temperature between about 400° C. and about 1,500° C. In alternative embodiments, the anneal is performed using spike annealing, sub-second annealing, or the like.

Figure 19:
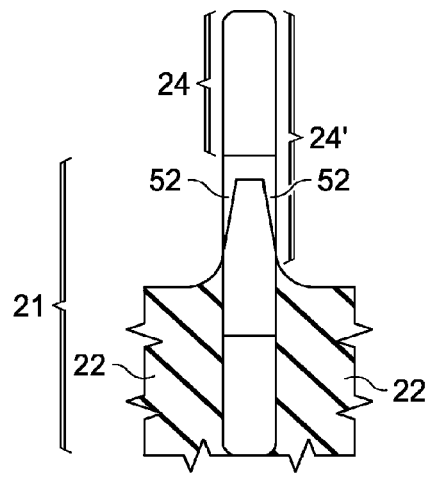
Figure 20:
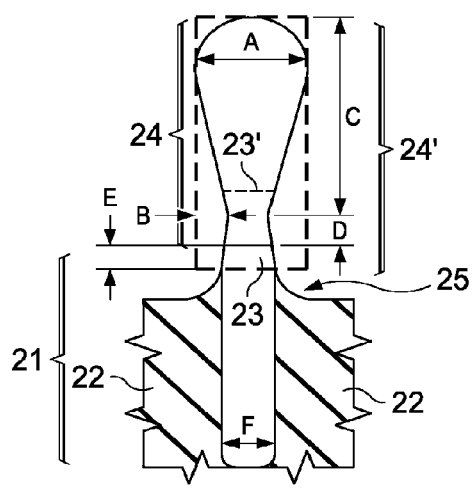

The subsequent steps in these embodiments are shown in FIGS. 19 and 20, which are essentially the same as the steps shown in FIGS. 15 and 16.

Figure 21:
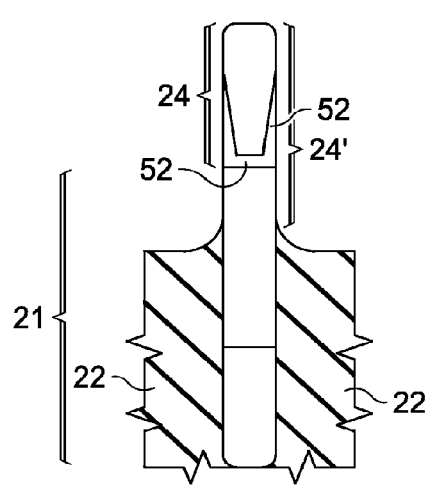
FIG. 21 is a cross-sectional view in the removing of inter-diffused regions in semiconductor fins in accordance with alternative embodiments.
Figure 24:
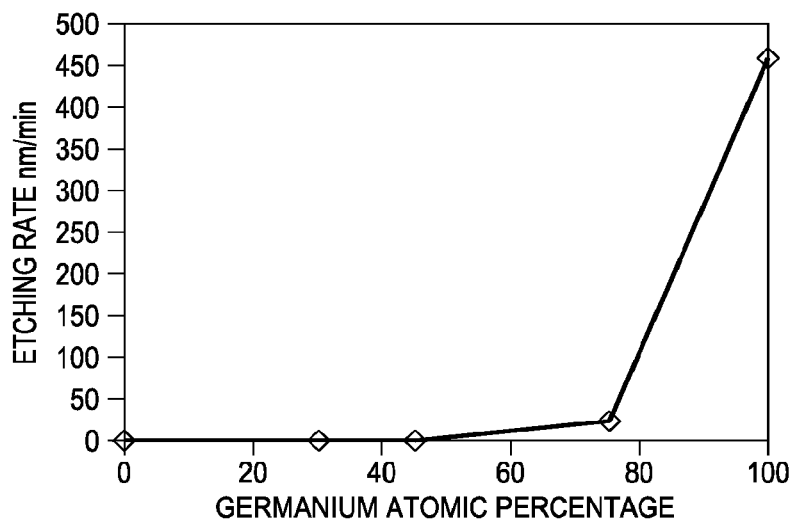

FIG. 21 illustrates a profile of inter-diffused regions 52, which is resulted from the structure in which semiconductor strip 24 has a lower germanium atomic percentage than semiconductor strip 21. As shown in FIG. 21, inter-diffused regions 52 mainly extends upwardly to surround a lower portion of semiconductor strip 24. In the respective embodiments, an etchant having the characteristic as shown in FIG. 24 may be used. The resulting fin, after the inter-diffused regions 52 are etched, are essentially the same as what is shown in FIGS. 16 and 20.

FIG. 24 illustrates a schematic graph showing the etching rate (of inter-diffused regions 52 and semiconductor strips 21 and 24) as a function of the germanium atomic percentage in the respective regions. As shown in FIG. 23, in a certain range of germanium atomic percentage, with the increase in the germanium atomic percentage, the etching rate increases. Accordingly, inter-diffused regions 52 are etched faster than semiconductor strip 24 (which has a lower germanium atomic percentage than inter-diffused regions 52) in some embodiments. In some exemplary embodiment, the etchants that has the characteristic as shown in FIG. 24 include APM, SPM, HPM, $H_2O_2$, $O_3$, $H_3PO_4$, $HNO_3$, $H_2SO_4$, or the like.

After the fins 24' having the profile as shown in FIGS. 16 and 20 are formed, as shown in FIG. 22, a replacement gate including a gate dielectric and a gate electrode is formed in recesses 50 (FIGS. 13A through 13C). FIG. 22 illustrates an exemplary cross-sectional view showing a portion of the replacement gate. In the respective formation process, gate dielectric layer 53 is formed as a blanket layer in recesses 50 (FIGS. 13A through 13C) and on the top surfaces and the sidewalls of semiconductor fin 24' and ILD 44. In accordance with some embodiments, gate dielectric layer 53 comprises silicon oxide, silicon nitride, or multilayers thereof. In alternative embodiments, gate dielectric layer 53 comprises a high-k dielectric material. In which embodiments, gate dielectric layer 53 may have a k value greater than about 7.0, and may include a metal oxide or a silicate of Hf, Al, Zr, La, Mg, Ba, Ti, Pb, and combinations thereof. The formation methods of gate dielectric layer 53 may include Molecular-Beam Deposition (MBD), Atomic Layer Deposition (ALD), Plasma Enhanced Chemical Vapor Deposition (PECVD), or the like. Next, conductive material 54 is formed over gate dielectric layer 53, and fills the remaining recess 50 (FIGS. 13A through 13C). Conductive material 54 may comprise a metal-containing material such as TiN, TaN, TaC, Co, Ru, Al, combinations thereof, or multi-layers thereof. After the filling of conductive material 54, a CMP is performed to remove the excess portions of gate dielectric layer 53 and conductive material 54, which excess portions are over the top surface of hard mask layer 48 (FIG. 13A). The resulting remaining portions of conductive material 54 and gate dielectric layer 53 thus form a replacement gate of the resulting FinFET.

Figure 25:
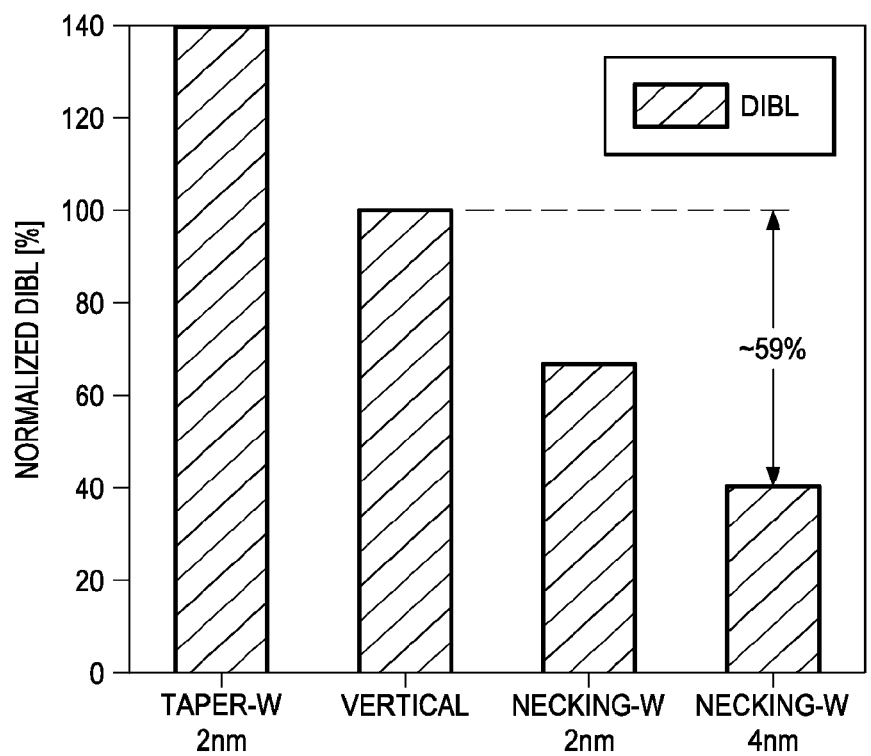
FIG. 25 illustrates simulation results of normalized Drain-Induced Barrier Lowering (DIBL) of several FinFETs, whose fins have different cross-sectional shapes.

In the embodiments of the present disclosure, by etching the inter-diffused regions 52 (FIG. 15), the inter-diffused regions are removed from the final FinFET. The inter-diffused regions, which have a gradient germanium atomic percentage, adversely affect the gate control ability and the hole mobility of the FinFET. Accordingly, the removal of the inter-diffused regions results in the improved device performance. FIG. 25 illustrates the simulated normalized Drain-Induced Barrier Lowering (DIBL) of several FinFETs. The FinFET marked as "taper-W 2 nm" indicates that the magnitude of fin-width near the fin-bottom is greater than its width near the fin-top by a difference greater than about 2 nm. The FinFET marked as "vertical" has vertical fins. The FinFET marked as "Necking-W 2 nm" has the structure in FIG. 16, with value B being 2 nm. The FinFET marked as "Necking-W 4 nm" has the structure in FIG. 16, with value B being 4 nm. As shown in FIG. 25, the FinFETs with necking in fins (in accordance with the embodiments of the present disclosure) have lower DIBL than the FinFETs having tapered and vertical fins. Compared with the FinFET with vertical fins, the DIBL of the FinFET with 4 nm necking is improved by 59 percent. Furthermore, the FinFETs with greater necking (4 nm) results in better DIBL than the FinFETs with smaller necking (2 nm).

Figure 26:
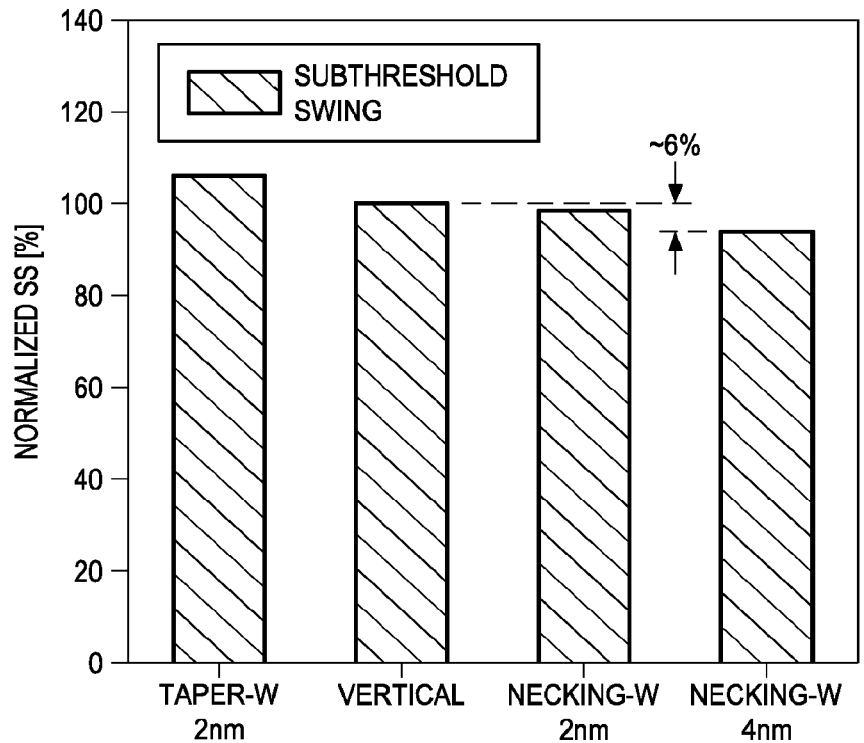
FIG. 26 illustrates simulation results of normalized sub-threshold swing of several FinFETs, whose fins have different cross-sectional shapes.

FIG. 26 illustrates the simulation results, wherein normalized Sub-threshold Swing (SS) of several FinFETs are illustrated. Again, the FinFETs with necking in fins in accordance with the embodiments of the present disclosure have lower SS than the FinFETs having tapered and vertical fins. Compared with the FinFET with the vertical fins, the SS of the FinFET with 4 nm necking is improved by 6 percent. Furthermore, the FinFETs with greater necking (4 nm) results in better SS than the FinFETs with smaller necking (2 nm).

Figure 27:
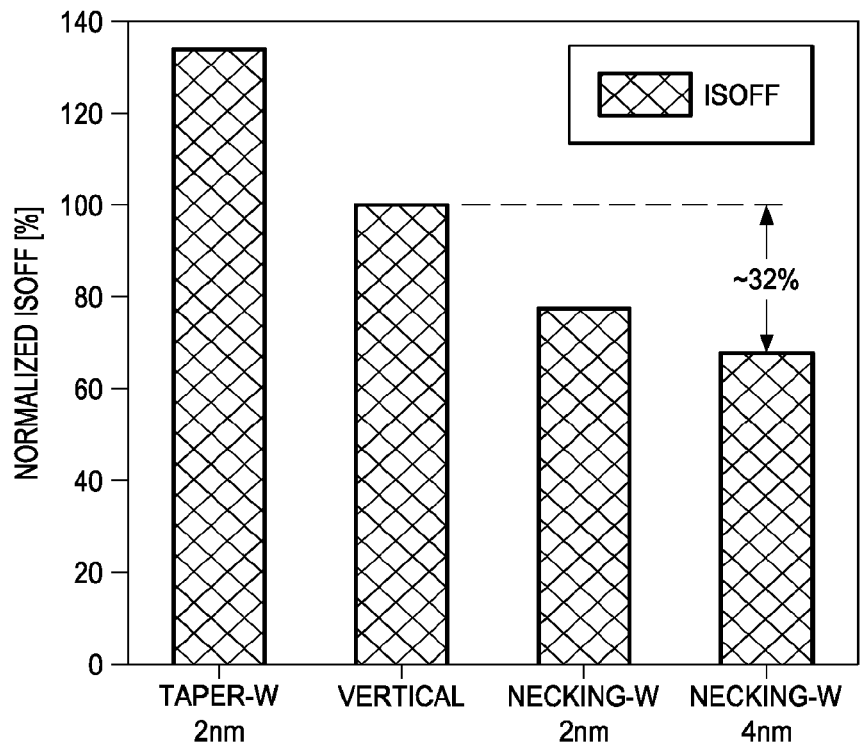
FIG. 27 illustrates simulation results of normalized leakage currents of several FinFETs, whose fins have different cross-sectional shapes.

FIG. 27 illustrates the simulation results, wherein normalized leakage current Isoff of several FinFETs are illustrated. Again, the FinFETs with necking in fins in accordance with the embodiments of the present disclosure have lower Isoff than the FinFETs having tapered and vertical fins. Compared with the FinFET with vertical fins, the Isoff of the FinFET with 4 nm necking is improved by 32 percent. Furthermore, the FinFETs with greater necking (4 nm) results in better Isoff than the FinFETs with smaller necking (2 nm).

In accordance with some embodiments, a method includes forming isolation regions in a semiconductor substrate, forming a first semiconductor strip between opposite portions of isolation regions, forming a second semiconductor strip overlying and contacting the first semiconductor strip, and performing a first recessing to recess the isolation regions. A portion of the second semiconductor strip over top surfaces of remaining portions of the isolation regions forms a semiconductor fin. A second recessing is performed to recess the isolation regions to extend the semiconductor fin downwardly, with an inter-diffusion region of the first semiconductor strip and the second semiconductor strip being exposed after the second recessing. The inter-diffusion region is then etched.

In accordance with other embodiments, a method includes forming STI regions in a semiconductor substrate, with a portion of the semiconductor substrate between opposite portions of the STI regions acting as a first semiconductor strip. The method further includes recessing a portion of the first semiconductor strip to form a first recess, performing an epitaxy to grow a second semiconductor strip in the recess, wherein the second semiconductor strip contacts the first semiconductor strip, and performing a first recessing to recess the STI regions. A portion of the second semiconductor strip is over top surfaces of the recessed STI regions, and forms a semiconductor fin. The method further includes forming a dummy gate stack to cover a middle portion of the semiconductor fin, forming source and drain regions on opposite sides of the middle portion of the semiconductor fin, forming an ILD to cover the source and drain regions, removing the dummy gate stack to form a second recess, wherein the middle portion of the semiconductor fin is exposed to the second recess, performing a second recessing to recess the STI regions, etching an inter-diffusion region of the first semiconductor strip and the second semiconductor strip through the second recess, and forming a gate dielectric and a gate electrode in the second recess. The gate dielectric and the gate electrode are over the middle portion of the semiconductor fin.

In accordance with yet other embodiments, an integrated circuit device includes isolation regions extending into a semiconductor substrate, and a semiconductor strip between opposite portions of the isolation regions. The semiconductor strip includes a lower portion with opposite sidewalls contacting the opposite portions of the isolation regions, wherein the lower portion has a first germanium atomic percentage, and an upper portion overlying the lower portion, wherein the upper portion has a second germanium atomic percentage different from the first germanium atomic percentage. The upper portion and a top part of the lower portion form a semiconductor fin over top surfaces of the isolation regions. The semiconductor strip includes a necking portion as a part of one of the upper portion and the lower portion, with the necking portion having a width smaller than a first width of a first portion of semiconductor strip and a second width of a second portion of semiconductor strip. The first portion and the second portion are overlying and underlying, respectively, the necking portion. A gate dielectric is on a top surface and sidewalls of the semiconductor fin. A gate electrode is over the gate dielectric.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit device comprising:
a semiconductor region comprising:
an upper portion having a first width;
a lower portion overlapped by the upper portion and having a second width; and
a middle portion overlapped by the upper portion and overlapping the lower portion, wherein a narrowest part of the semiconductor region is in the middle portion, and widths of the semiconductor region gradually increase from the narrowest part to the upper portion, and gradually increase from the narrowest part to the lower portion, and the middle portion has a gradually changed germanium atomic percentage;
a gate dielectric on a top surface and sidewalls of the semiconductor region, wherein the gate dielectric extends below the narrowest part; and
a gate electrode over the gate dielectric.

2. The integrated circuit device of claim 1, wherein the upper portion has a first germanium atomic percentage, and the lower portion has a second germanium atomic percentage different from the first germanium atomic percentage.

3. The integrated circuit device of claim 2, wherein the lower portion comprises silicon germanium, and the upper portion comprises silicon and is free from germanium.

4. The integrated circuit device of claim 2, wherein the upper portion comprises silicon germanium, and the lower portion comprises silicon and is free from germanium.

5. The integrated circuit device of claim 2, wherein the first germanium atomic percentage is higher than about 60 percent.

6. The integrated circuit device of claim 1 further comprising isolation regions on opposite sides of, and contacting edges of the semiconductor region, wherein top surfaces of the isolation regions are lower than the middle portion.

7. The integrated circuit device of claim 6, wherein an entirety of the lower portion has a substantially straight sidewall, and a top end of the substantially straight sidewall is substantially coplanar with the top surfaces of the isolation regions.

8. The integrated circuit device of claim 7, wherein a portion of the isolation regions has a top tip joining the substantially straight sidewall, and the top tip is substantially coplanar with the top end of the substantially straight sidewall.

9. The integrated circuit device of claim 1, wherein a width of the narrowest part is smaller than a width of a widest portion of the upper portion of the semiconductor region by a difference in a range between about 2 nm and about 14 nm.

10. An integrated circuit device comprising:
isolation regions extending into a semiconductor substrate;
a semiconductor region between opposite portions of the isolation regions, wherein the semiconductor region comprises:
a lower portion with opposite sidewalls contacting the opposite portions of the isolation regions, wherein the lower portion has a first germanium atomic percentage;
an upper portion overlying the lower portion, wherein the upper portion has a second germanium atomic percentage different from the first germanium atomic percentage, and wherein the upper portion and a top part of the lower portion form a semiconductor fin higher than top surfaces of the isolation regions; and
a necking portion as a part of one of the upper portion and the lower portion, with the necking portion having a width smaller than a first width of a first portion of semiconductor region and a second width of a second portion of semiconductor region, wherein the first portion and the second portion are overlying and underlying, respectively, the necking portion, and the necking portion is overlying an interface between the lower portion and the upper portion;
a gate dielectric on a top surface and sidewalls of the semiconductor fin; and
a gate electrode over the gate dielectric.

11. The integrated circuit device of claim 10, wherein a width of the necking portion is smaller than a width of a widest portion of the upper portion of the semiconductor region by a difference in a range between about 2 nm and about 14 nm.

12. The integrated circuit device of claim 10, wherein top surfaces of the isolation regions are lower than the necking portion.

13. The integrated circuit device of claim 10, wherein the upper portion has a first germanium atomic percentage higher than a second germanium atomic percentage of the lower portion.

14. The integrated circuit device of claim 10, wherein an entirety of the necking portion is higher than the top surfaces of the isolation regions.

15. An integrated circuit device comprising:
isolation regions extending into a semiconductor substrate;
a semiconductor strip between opposite portions of the isolation regions;
a semiconductor fin protruding higher than top surfaces of the isolation regions, wherein the semiconductor fin overlaps the semiconductor strip and comprises:
a first portion having a first width; and
a second portion lower than and overlapped by the first portion, wherein the second portion has second widths smaller than the first width, and the second widths gradually changes in the second portion;
a gate dielectric on a top surface and sidewalls of the semiconductor fin; and
a gate electrode over the gate dielectric, wherein the second portion has a narrowest portion, and the narrowest portion is located at a level higher than top surfaces of the isolation regions.

16. The integrated circuit device of claim 15, wherein some parts of the first portion that are increasingly higher than the narrowest portion have increasingly greater widths.

17. The integrated circuit device of claim 15, wherein some parts of the second portion that are increasingly lower than the narrowest portion have increasingly greater widths.

18. The integrated circuit device of claim 15, wherein a width of the narrowest portion of the second portion is smaller than a width of a widest portion of the first portion by a difference in a range between about 2 nm and about 14 nm.

19. The integrated circuit device of claim 15, wherein the first portion has a first germanium atomic percentage higher than a second germanium atomic percentage of the second portion.

20. The integrated circuit device of claim 15, wherein an entirety of the second portion is higher than the top surfaces of the isolation regions.

\* \* \* \* \*